United States Patent
Seethamraju et al.

(10) Patent No.: US 7,443,250 B2
(45) Date of Patent: Oct. 28, 2008

(54) PROGRAMMABLE PHASE-LOCKED LOOP RESPONSIVE TO A SELECTED BANDWIDTH AND A SELECTED REFERENCE CLOCK SIGNAL FREQUENCY TO ADJUST CIRCUIT CHARACTERISTICS

(75) Inventors: Srisai R. Seethamraju, Nashua, NH (US); Ronald B. Hulfachor, Nashua, NH (US); William J. Anker, Londonderry, NH (US); Richard J. Juhn, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 69 days.

(21) Appl. No.: 11/560,989

(22) Filed: Nov. 17, 2006

(65) Prior Publication Data
US 2008/0079510 A1    Apr. 3, 2008

Related U.S. Application Data

(60) Provisional application No. 60/827,530, filed on Sep. 29, 2006.

(51) Int. Cl.
  *H03L 7/08* (2006.01)
  *H03L 7/087* (2006.01)
  *H03L 7/18* (2006.01)

(52) U.S. Cl. .............................. 331/17; 331/11; 331/16; 331/25; 331/44

(58) Field of Classification Search ................ 331/1 A, 331/8, 10, 11, 15–18, 25, 44; 327/156–159; 332/127; 360/51; 375/376; 455/260
See application file for complete search history.

(56) References Cited

U.S. PATENT DOCUMENTS

| | | | |
|---|---|---|---|
| 4,563,767 A | 1/1986 | Brandt | |
| 5,128,632 A * | 7/1992 | Erhart et al. | ................ 331/1 A |
| 5,821,816 A | 10/1998 | Patterson | |
| 6,366,146 B2 | 4/2002 | Fredriksson | |
| 6,392,495 B1 | 5/2002 | Larsson | |
| 6,498,536 B1 | 12/2002 | Mori | |
| 6,741,109 B1 | 5/2004 | Huang et al. | |

(Continued)

OTHER PUBLICATIONS

"Clocks for the Synchronized Network: Common Generic Criteria," GR-1244-CORE, Issue 1, Jun. 1995, pp. 3-1, 3-2, and 3-9.

(Continued)

*Primary Examiner*—David Mis
(74) *Attorney, Agent, or Firm*—Zagorin O'Brien Graham LLP

(57) ABSTRACT

A technique that is readily implemented in monolithic integrated circuits includes a phase-locked loop (PLL) that generates an output clock signal based on a reference clock signal and selectable configuration parameters. A method includes providing to a PLL circuit, selected configuration information based, at least in part, on a selected frequency of a reference clock signal and a selected PLL bandwidth. The method includes generating an output clock signal, by the PLL circuit, based, at least in part, on the reference clock signal and the selected configuration information. The method includes storing in a storage circuit, a plurality of sets of configuration information corresponding to a range of frequencies of the reference clock signal and a range of PLL bandwidths. The selected configuration information is accessed from the plurality of sets of configuration information according to the selected frequency and the selected bandwidth.

31 Claims, 12 Drawing Sheets

U.S. PATENT DOCUMENTS

| | | |
|---|---|---|
| 6,920,622 B1 | 7/2005 | Garlepp et al. |
| 2002/0061088 A1 | 5/2002 | Kon |
| 2008/0079501 A1 | 4/2008 | Hulfachor |

OTHER PUBLICATIONS

Wei, Derrick C. et al., "A Monolithic Low-Bandwidth Jitter-Cleaning PLL with Hitless Switching for SONET/SDH Clock Generation," 2006 IEEE International Solid-State Circuits Conference, Session 13.3, Digest of Technical Papers, First Edition, vol. 49, Feb. 2006, pp. 176-177 and 236-237.

Notice of Allowance mailed May 14, 2008 in U.S. Appl. No. 11/537,082, filed Sep. 29, 2006, entitled, "Technique for Switching Between Input Clocks in a Phase-Locked Loop," and naming inventors Ronald Hulfachor, Srisai Seethamraju , and Shailesh Chitnis, 6 pages.

* cited by examiner

| $f_{REF}$\p | 11 | 10 | 9 | 8 | 7 | 6 | 5 | 4 | 3 | 2 | 1 |
|---|---|---|---|---|---|---|---|---|---|---|---|
| 2 | | | | | | | | | | | |
| 4 | | | | | | | | | | | 60 |
| 8 | | | | | | | | | | 60 | 120 |
| 16 | | | | | | | | | 60 | 120 | 240 |
| 32 | | | | | | | | 60 | 120 | 240 | 480 |
| 64 | | | | | | | 60 | 120 | 240 | 480 | 960 |
| 128 | | | | | 60 | 60 | 120 | 240 | 480 | 960 | 1920 |
| 256 | | | | 60 | 120 | 240 | 480 | 960 | 1920 | 1920 | 3840 |
| 512 | | | 60 | 120 | 240 | 480 | 960 | 1920 | 3840 | 3840 | 7680 |
| 1024 | | 60 | 120 | 240 | 480 | 960 | 1920 | 3840 | 7680 | | |
| 2048 | 60 | 120 | 240 | 480 | 960 | 1920 | 3840 | | | | |

FIG. 10A : $f_{REF}$ (kHz) and PLL BANDWIDTH (Hz)

| $f_{REF}$\p | 11 | 10 | 9 | 8 | 7 | 6 | 5 | 4 | 3 | 2 | 1 |
|---|---|---|---|---|---|---|---|---|---|---|---|
| 2 | | | | | | | | | | | 2560000 |
| 4 | | | | | | | | | | 1280000 | 1280000 |
| 8 | | | | | | | | | 640000 | 640000 | 640000 |
| 16 | | | | | | | | 320000 | 320000 | 320000 | 320000 |
| 32 | | | | | | | 160000 | 160000 | 160000 | 160000 | 160000 |
| 64 | | | | | | 80000 | 80000 | 80000 | 80000 | 80000 | 80000 |
| 128 | | | | | 40000 | 40000 | 40000 | 40000 | 40000 | 40000 | 40000 |
| 256 | | | | 20000 | 20000 | 20000 | 20000 | 20000 | 20000 | 20000 | 20000 |
| 512 | | | 10000 | 10000 | 10000 | 10000 | 10000 | 10000 | 10000 | 10000 | |
| 1024 | | 5000 | 5000 | 5000 | 5000 | 5000 | 5000 | 5000 | 5000 | | |
| 2048 | 2500 | 2500 | 2500 | 2500 | 2500 | 2500 | 2500 | 2500 | | | |

| $f_{REF}\backslash p$ | 11 | 10 | 9 | 8 | 7 | 6 | 5 | 4 | 3 | 2 | 1 |
|---|---|---|---|---|---|---|---|---|---|---|---|
| 2 | | | | | | | | | | | |
| 4 | | | | | | | | | | | |
| 8 | | | | | | | | | | | | 
| 16 | | | | | 4 | 4 | 4 | 4 | 4 | 4 | 4 |
| 32 | | | 4 | 4 | 8 | 8 | 8 | 8 | 8 | 8 | 8 |
| 64 | | | 4 | 8 | 16 | 16 | 16 | 16 | 16 | 16 | 16 |
| 128 | | 2 | 4 | 8 | 16 | 32 | 32 | 32 | 32 | 32 | 32 |
| 256 | | 2 | | 8 | 16 | 32 | 32 | 32 | 32 | 32 | 32 |
| 512 | 1 | | | | 16 | 32 | 32 | 32 | 32 | 32 | |
| 1024 | | | | | | 32 | 32 | 32 | | | |
| 2048 | | | | | | | | | | | |

FIG. 10D : $f_{ONESHOT}$ (MHz)

| $f_{REF}\backslash p$ | 11 | 10 | 9 | 8 | 7 | 6 | 5 | 4 | 3 | 2 | 1 |
|---|---|---|---|---|---|---|---|---|---|---|---|
| 2 | | | | | | | | | | | |
| 4 | | | | | | | | | | | 156 |
| 8 | | | | | | | | | | 156 | 78 |
| 16 | | | | | | | | | 156 | 78 | 39 |
| 32 | | | | | | | | 156 | 78 | 39 | 19 |
| 64 | | | | | | | 156 | 78 | 39 | 19 | 19 |
| 128 | | | | | 156 | 156 | 78 | 39 | 19 | 19 | 19 |
| 256 | | | 156 | 156 | 78 | 78 | 39 | 19 | 19 | 19 | 19 |
| 512 | | 311 | 156 | 78 | 39 | 39 | 19 | 19 | 19 | 19 | |
| 1024 | | 311 | | 78 | 39 | 19 | 19 | 19 | | | |
| 2048 | 622 | | | | | | | | | | |

| $f_{REF}/p$ | 11 | 10 | 9 | 8 | 7 | 6 | 5 | 4 | 3 | 2 | 1 |
|---|---|---|---|---|---|---|---|---|---|---|---|
| 2 | | | | | | | | | | | |
| 4 | | | | | | | | | | | |
| 8 | | | | | | | | | | | |
| 16 | | | | | | | -- | -- | -- | -- | -- |
| 32 | | | | | | -- | 4210 | 4210 | 4210 | 4210 | 4210 |
| 64 | | | | | 1052 | 2104 | 4210 | | | | |
| 128 | | | | 1052 | 2104 | 4210 | 8420 | 8400 | 8400 | 8400 | |
| 256 | | | 1052 | 2104 | 4210 | 8420 | 16800 | 16800 | 16800 | | |
| 512 | | 1052 | 2104 | 4210 | 8420 | 16800 | 33700 | 33700 | | | |
| 1024 | 1052 | 2104 | 4210 | 8420 | 16800 | 33700 | 67400 | | | | |
| 2048 | | | | | | | | | | | |

Note: "--" indicates that fine auto-zero is disabled and only coarse tune auto-zero is enabled FIG. 10E : Default fine AZ loop bandwidth (Hz)

US 7,443,250 B2

PROGRAMMABLE PHASE-LOCKED LOOP RESPONSIVE TO A SELECTED BANDWIDTH AND A SELECTED REFERENCE CLOCK SIGNAL FREQUENCY TO ADJUST CIRCUIT CHARACTERISTICS

CROSS-REFERENCE TO RELATED APPLICATION(S)

This application claims benefit under 35 U.S.C. §119 of provisional application No. 60/827,530, filed Sep. 29, 2006, entitled "Hitless Switching Architecture," naming Srisai R. Seethamraju, Ronald B. Hulfachor, and Shailesh Chitnis as inventors, which application is incorporated by reference herein.

BACKGROUND

1. Field of the Invention

This invention relates to phase-locked loops, and more particularly to phase-locked loops with selectable input clock signals.

2. Description of the Related Art

In optical communication systems, line cards compliant with standards such as Synchronous Optical Network (SONET) or Synchronous Digital Hierarchy (SDH) (the European counterpart to SONET) utilize clock generation circuits to generate clocks used in data transmission and reception. In such clock generation circuits, a phase-locked loop (PLL) receives an input reference clock and generates one or more high-speed clocks suitable for use in transmitting or receiving data in a SONET or SDH based system. According to one aspect of those communication systems, multiple reference clocks may be supplied to a clock generation circuit to provide a variety of capabilities, including redundancy. When the PLL in the clock generation circuit switches from using one input reference clock to using another input reference clock, a phase glitch may arise due to an arbitrary phase relationship between the two input clocks. Such phase changes in the output clock can introduce transmission errors or other problems.

In order to reduce or eliminate phase glitches when switching between input clocks, one approach to achieve such "hitless switching" is to set the bandwidth of the PLL used to multiply the reference clock to be very low, e.g., on the order of Hz. With the low-bandwidth PLL, even if the phase difference between the input clocks is relatively large, the output phase change resulting from switching input reference clocks used by the PLL would occur relatively slowly. The low-bandwidth PLL implementation can meet the tight phase transient requirements and thereby reduce or eliminate transmission errors associated with switching reference clocks. However, low-bandwidth PLLs suitable for meeting tight phase transient requirements may be difficult to implement in a monolithic integrated circuit and may be expensive or difficult to implement with discrete components. In addition, low-bandwidth PLLs typically achieve lock relatively slowly and typically generate output clocks having increased jitter due to reduced filtering of the output of a voltage-controlled oscillator (VCO) included in the PLL. In some applications, a maximum time interval error (MTIE) is specified (e.g., an MTIE of 1000 ns), which is a limit on the amount of phase movement as a function of time after a switch between input clocks, and generally cannot be satisfied merely by adjusting the PLL bandwidth.

SUMMARY

A technique that is readily implemented in monolithic integrated circuits includes a phase-locked loop (PLL) that generates an output clock signal based on a reference clock signal and selectable configuration parameters. In at least one embodiment of the invention, a method includes providing to a PLL circuit, selected configuration information based, at least in part, on a selected frequency of a reference clock signal and a selected PLL bandwidth. The method includes generating an output clock signal, by the PLL circuit, based, at least in part, on the reference clock signal and the selected configuration information. The method includes storing in a storage circuit, a plurality of sets of configuration information corresponding to a range of frequencies of the reference clock signal and a range of PLL bandwidths. The selected configuration information is accessed from the plurality of sets of configuration information according to the selected frequency and the selected bandwidth.

In at least one embodiment of the invention, an apparatus includes a programmable PLL configured to generate an output signal based, at least in part, on a reference clock signal. The PLL has a bandwidth selectable from a range of PLL bandwidths. A frequency of the reference clock signal is selectable from a range of reference clock signal frequencies. The apparatus includes a first storage circuit configured to provide configuration information to the PLL based, at least in part, on the reference clock signal frequency and the PLL bandwidth.

BRIEF DESCRIPTION OF THE DRAWINGS

The present invention may be better understood, and its numerous objects, features, and advantages made apparent to those skilled in the art by referencing the accompanying drawings.

FIGS. 10A-E illustrate exemplary configuration information consistent with at least one embodiment of the PLL of FIG. 6.

The use of the same reference symbols in different drawings indicates similar or identical items.

DESCRIPTION OF THE PREFERRED EMBODIMENT(S)

Figure 1A:
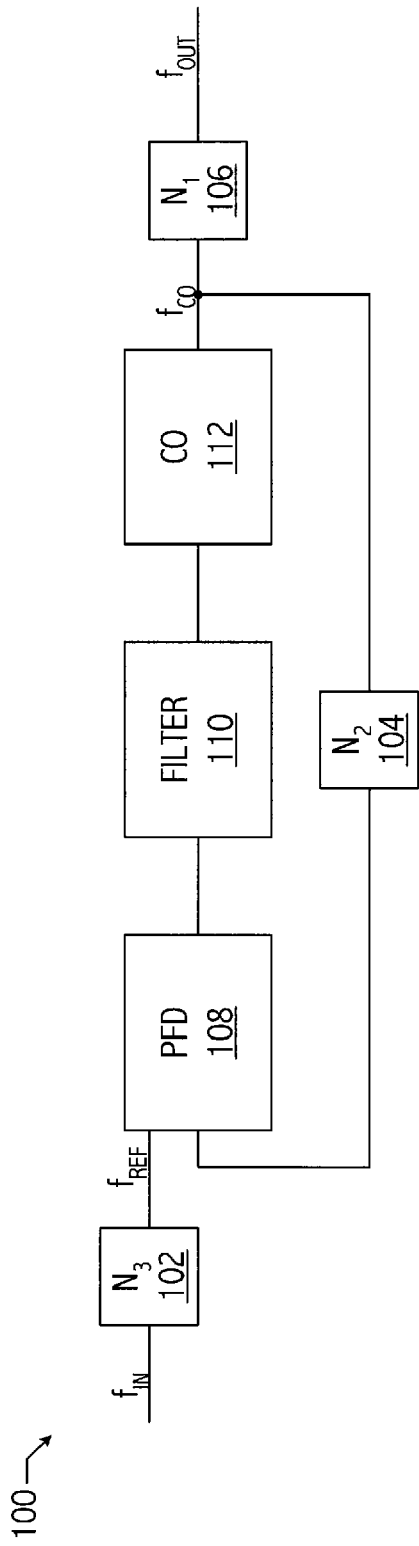
FIG. 1A illustrates a block diagram of an exemplary phase-locked loop (PLL) consistent with at least one embodiment of the present invention.

Referring to FIG. 1A, a phase-locked loop (i.e., PLL) has a programmable bandwidth (i.e., $f_{3dB}$) and a programmable reference frequency (i.e., $f_{REF}$). In at least one embodiment of PLL 100, the bandwidth of PLL 100 may be quantified as follows:

$$f_{3dB} = \left(\frac{f_{REF}}{d \times 2^p}\right) \times c_f(N_2, p),$$

where p is an index value, e.g., 0, 1, 2, ..., 11, and $$f_{REF} = \frac{f_{IN}}{N_3} = \frac{f_{CO}}{N_2}.$$

The variable $c_f(N_2, p)$ is a correction factor that is based on the value of feedback divider 104 (i.e., $N_2$) and the index value p. A value of p corresponds to a particular $f_{3dB}$ associated with a particular $f_{REF}$, as illustrated in FIG. 10A. The variable d is based on the index value p and is a factor that adjusts for implementing a continuous time system using a discrete time PLL. In at least one embodiment of PLL 100, a user provides a particular value of p and a particular $f_{REF}$, which correspond to a particular $f_{REF}$ and $f_{3dB}$ pair. The values of $f_{REF}$ and p are used to determine various parameters that are used to configure PLL 100 to achieve the target $f_{REF}$ and $f_{3dB}$. FIGS. 10B-E illustrate exemplary parameter values corresponding to the $f_{REF}$ and $f_{3dB}$ pairs of FIG. 10A.

Referring back to FIG. 1A, the bandwidth of PLL 100 in terms of circuit parameters may be represented as follows:

$$f_{3dB} = \frac{1}{2 \times 3.14} \times LFS \times 2^{(NF-25)} \times \frac{K_{CO}}{f_{CO}} \times K_c,$$

where the full-scale of phase and frequency detector 108 (i.e., LFS) is:

$$LFS = \frac{I_{cpd} \times I_{cpu} \times f_{REF}}{I_{fd} \times I_{fbu}}.$$

Figure 1B:
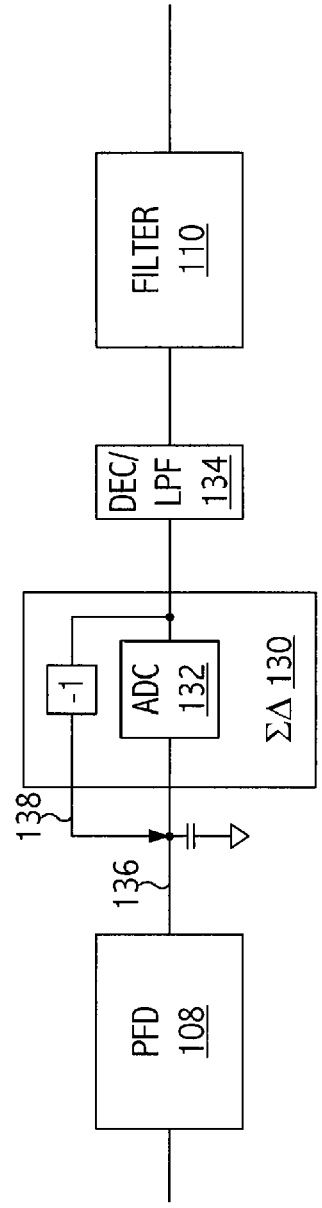
FIG. 1B illustrates a block diagram of an exemplary portion of the PLL of FIG. 1A consistent with at least one embodiment of the present invention.

NF is a programmable gain factor in a proportional component of filter 110, Kco is the gain of controllable oscillator 112, $f_{CO}$ is the frequency of the output signal of controllable oscillator 112, and Kc is a gain correction factor. Referring to FIG. 1B, the parameter $I_{cpd}$ and parameter $I_{fd}$, are digital words corresponding to the number of units of charge pump current (i.e., $I_{cpu}$) and the number of units of feedback current (i.e., $I_{fbu}$), respectively, that are used to form the charge pump current (i.e., $I_{cp}$) and feedback current (i.e., $I_f$) of signals 136 and 138, respectively. Parameters $I_{cpd}$ and $I_{fd}$ are programmable according to $f_{REF}$ and $f_{3dB}$. The ratio $I_{cp}/I_f$ and thus, LFS, are determined according to maximum time interval error (i.e., MTIE) specifications, sinusoidal jitter tolerance, and linearity of phase and frequency detector 108. In at least one embodiment, PLL 100 is configured to have a ratio $I_{cp}/I_f$ that is four times the minimum ratio required to meet the MTIE specifications.

In at least one embodiment of PLL 100, LFS is determined based on a maximum input phase error that a phase detector experiences during a phase ramp:

$$LFS = \frac{m_{ramp}}{2 \times \pi \times f_{3dB}},$$

where $m_{ramp}$ is the maximum MTIE ramp slope in sec/sec. Accordingly, the loop phase-detector full-scale is set to approximately 2-3 times greater than the minimum required, thereby reducing or avoiding saturation of phase and frequency detector 108 and ensuring linearity of phase and frequency detector 108.

Figure 1C:
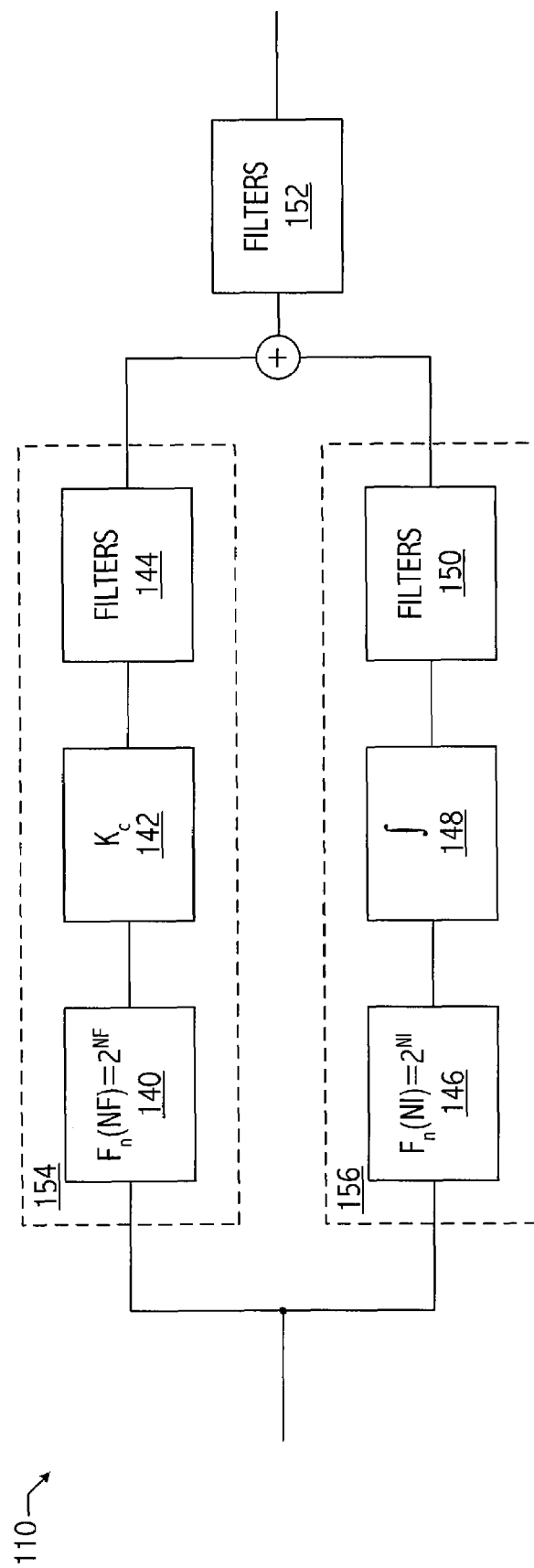
FIG. 1C illustrates a block diagram of an exemplary filter of the PLL of FIG. 1A consistent with at least one embodiment of the present invention.

Referring to FIG. 1C, an exemplary filter 110 is illustrated in greater detail. The locations of the zero and higher order poles introduced by proportional path 154 and integral path 156 are programmable according to selected values of $f_{REF}$ and $f_{3dB}$. Referring back to FIG. 1C, a jitter transfer function associated with the PLL and a jitter attenuation capability of the PLL are based on at least the selected bandwidth of the PLL, a zero and higher order poles of the PLL. Thus, the jitter transfer function and jitter attenuation associated with PLL 100 are programmable.

Referring back to FIG. 1A, the frequency relationships of PLL 100 are:

$f_{REF} = f_{IN}/N_3$;

$f_{CO} = N_2 \times f_{REF}$;

$f_{OUT} = f_{CO}/N_1$;

$f_{CO}\text{range} = f_{COmin} - f_{COmax}$;

$f_{REF}\text{range} = f_{REFmin} - f_{REFmax}$.

Dividers 102, 104, and 106 have programmable divide values $N_3$, $N_2$, and $N_1$, respectively. In at least one embodiment of PLL 100, $f_{REF}$ is divided into a plurality of intervals. The frequency interval of $f_{REF}$ is determined by a selected value for $N_2$. For example, the configuration tables illustrated in FIGS. 10A-E are based on the selected value for $N_2$ being 2. However, any suitable value for $N_2$ and corresponding configuration tables for the programmable parameters may be used.

In at least one embodiment of PLL 100, controllable oscillator 112 is implemented as a separate, digitally controlled phase-locked loop. An exemplary digitally controlled oscillator is described in United States Patent Application Publication No. US 2004/0232995 entitled "Dual Loop Architecture Useful for a Programmable Clock Source and Clock Multiplier Applications," naming Thomsen et al. as inventors, which is incorporated herein by reference. In at least one embodiment of PLL 100, controllable oscillator 112 is an integrated, low-noise voltage controlled oscillator circuit with a wide tuning range and phase and frequency detector 108 includes a low noise phase detector with a wide input frequency range. The dividers, controllable oscillator 112, and phase and frequency detector 108 enable PLL 100 to have a substantially continuous output frequency with a fine resolution, as discussed further, below. A target application determines a frequency plan for PLL 100, i.e., an input frequency and an output frequency and associated divider values $N_1$, $N_2$, and $N_3$, along with $f_{REF}$ and $f_{CO}$ frequency values for PLL 100. Terminals of an integrated circuit including PLL 100 may be coupled to circuitry that configures PLL 100 with one of a large number of different frequency plans, allowing configuration of PLL 100 to satisfy a wide range of specifications associated with a wide range of applications.

Figure 1D:
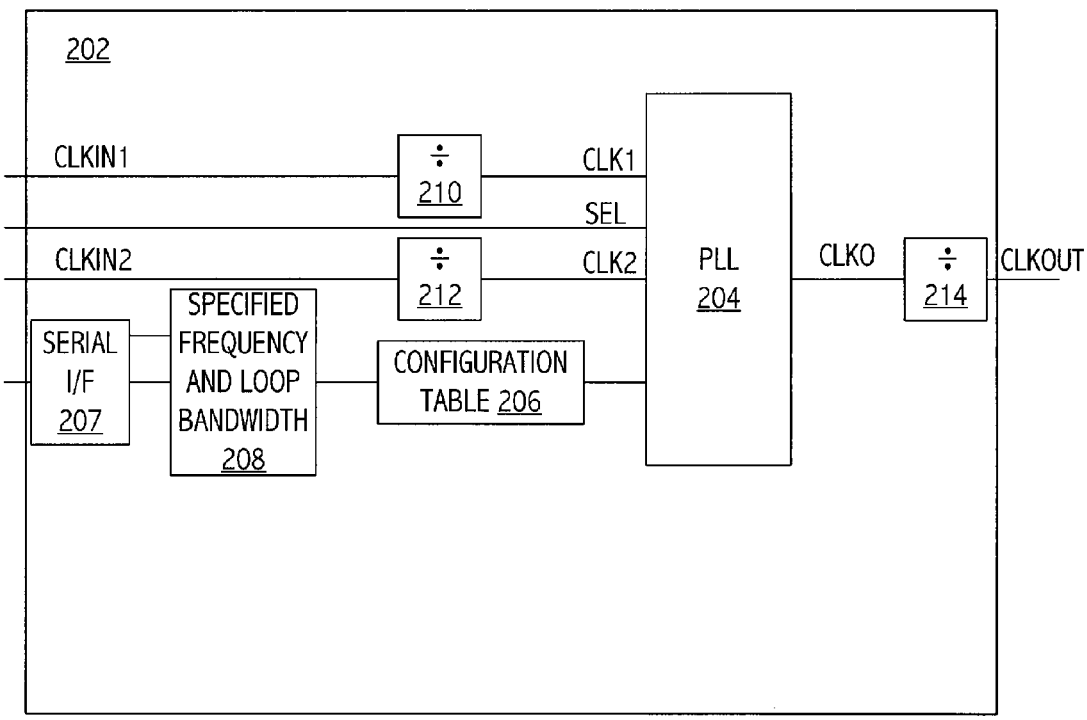
FIG. 1D illustrates a block diagram of an exemplary integrated circuit including a PLL consistent with at least one embodiment of the present invention.
Figure 2:
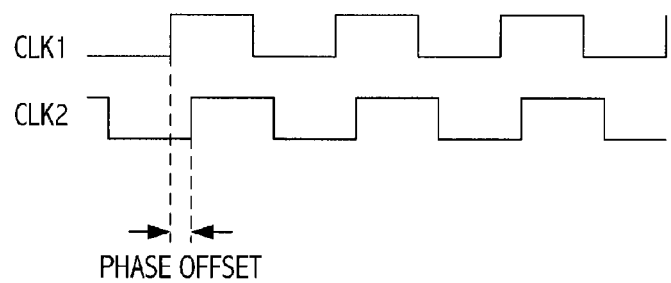
FIG. 2 illustrates timing waveforms of exemplary input clocks consistent with at least one embodiment of the present invention.

Referring to FIG. 1D, an integrated circuit (e.g., integrated circuit 202) includes a phase-locked loop (e.g., PLL 204) that receives at least two input clock signals (e.g., CLK1 and CLK2), any of which may be utilized as the reference clock signal by the phase-locked loop to generate an output clock signal (e.g., CLKO) according to at least one select signal (e.g., SEL). In at least one embodiment of PLL 204, the input clock signals CLK1 and CLK2 have substantially the same frequency. For example, the frequency difference between CLK1 and CLK2 may be less that 100 ppm, and in at least one embodiment of PLL 204, may be less than 1 ppm. However, the input clock signals CLK1 and CLK2 may have an arbitrary phase relationship, i.e., a particular edge (e.g., rising or falling) of the input clock signals are separated by an arbitrary delay. This arbitrary phase relationship may result in a phase offset, as illustrated in FIG. 2. Note that the relationship between phase ($\phi$, in degrees) and delay ($t_D$, in seconds), as referred to herein, is $\phi=360 \times t_D \times f$ (where frequency, f, is measured in Hz).

In at least one embodiment of integrated circuit 202, phase-locked loop 204 is a fractional-N PLL, i.e., the input clock signal (e.g., a selected one of CLK1 and CLK2) can be multiplied up by a rational number to supply a wide variety of output frequencies. The fractional-N loop can be viewed as a digitally controlled oscillator, where the output frequency is controlled by the rational digital number R according to $f_{OUT}=R \times f_{REF}$. Thus, PLL 204 can provide a wide range of output frequencies. The precision of R can be a few parts per billion. The precision of R in combination with a controllable oscillator that can provide a signal having an output frequency range of approximately +/−10%, may result in a PLL that provides an "any rate" frequency relationship between the frequency of the input clock signal and the frequency of the output clock singal. For example, the PLL may achieve an output having a wide range of frequencies and having high accuracy as compared to the desired frequency. In other embodiments, PLL 204 may utilize integer-N dividers in the feedback path and in the reference clock path along with a digitally controlled, fractional-N PLL for controllable oscillator 112.

Fractional-N phase-locked loops (PLLs) allow the multiplication of the input clock signal by a rational number rather than an integer number as is common in traditional PLL designs. Such a multiplication requires the use of a multi-modulus divider in the feedback path. A multi-modulus divider will divide not by a fixed integer, but by a sequence of integers that over time approximates the rational number desired. This sequence can be generated by a digital delta-sigma modulator which shapes the quantization noise added to the rational number with a high pass filter. Thus, the resulting phase noise is also shaped by a high pass filter. The overall noise contribution from the fractional PLL depends on several factors. One factor is the update rate of the PLL (generally the input clock signal rate) in relation to the loop bandwidth of the PLL, a measure similar to the oversampling ratio (OSR) in delta-sigma analog-to-digital converters (ADCs). A higher OSR allows for better suppression of quantization noise in a frequency band of interest. For a given update rate the noise contribution can be reduced by lowering the loop bandwidth. Another factor contributing to noise is the quantization error applied at the divider.

Good jitter performance of the DCO loop is facilitated by implementation of the loop filter as a digital filter, which is a technique that allows an accurate implementation of the loop filter that is properly matched to the corners and the order of the noise shaping function and therefore can reduce the jitter contribution from that source. Digital loop filter implementations are known in the art and described, e.g., in U.S. Pat. No. 6,630,868, entitled "Digitally Synthesized Loop Filter Circuit Particularly Useful for a Phase Locked Loop," naming Perrott et al. as inventors, which is incorporated herein by reference.

In at least one embodiment of integrated circuit 202, input clock signals CLK1 and CLK2 are based on input clock signals CLKIN1 and CLKIN2, which are received by integrated circuit 202. Input clock signals CLKIN1 and CLKIN2 may be frequency divided by divider circuits 210 and 212, respectively, to generate input clock signals CLK1 and CLK2, which have substantially the same frequency. Although input clock signals CLKIN1 and CLKIN2 may have substantially the same frequency, in at least one embodiment of integrated circuit 202, the frequencies of input clock signals CLKIN1 and CLKIN2 are different multiples of a target frequency for input clock signals CLK1 and CLK2 and divider circuits 210 and 212 may have different divide ratios, accordingly.

In at least one embodiment of integrated circuit 202, individual ones of the input clock signals may have a wide range of frequencies and the output clock signal may have a wide range of frequencies, i.e., the ranges of frequencies may span many orders of magnitude. In at least one embodiment of the invention, PLL 204 is configured based on at least a frequency specified for the input clock signals CLK1 and CLK2 and a loop bandwidth specified for PLL 204. Integrated circuit 202 may receive the specified frequency and specified bandwidth from off-chip and configure PLL 204 and divider circuits 210 and 212 based on parameters stored in configuration table 206 corresponding to the specified frequency and specified bandwidth. In at least one embodiment of integrated circuit 202, PLL 204 and divider circuits 210 and 212 are configured based on parameters received from off-chip, via serial interface 207. In an exemplary embodiment, integrated circuit 202 may receive input clock signals CLKIN1 and CLKIN2 having frequencies that range from approximately 2 kHz to approximately 710 MHz. The frequencies of input clock signals CLK1 and CLK2 may range from approximately 2 kHz to approximately 2 MHz, the divide values implemented by dividers 210 and 212 may be integers from 1 to $2^{19}$, and the CLKO signal may range from 2 kHz to 1.5 GHz. Output signal CLKO may be frequency divided by divider circuit 214 to generate output clock signal CLKOUT.

Figure 3:
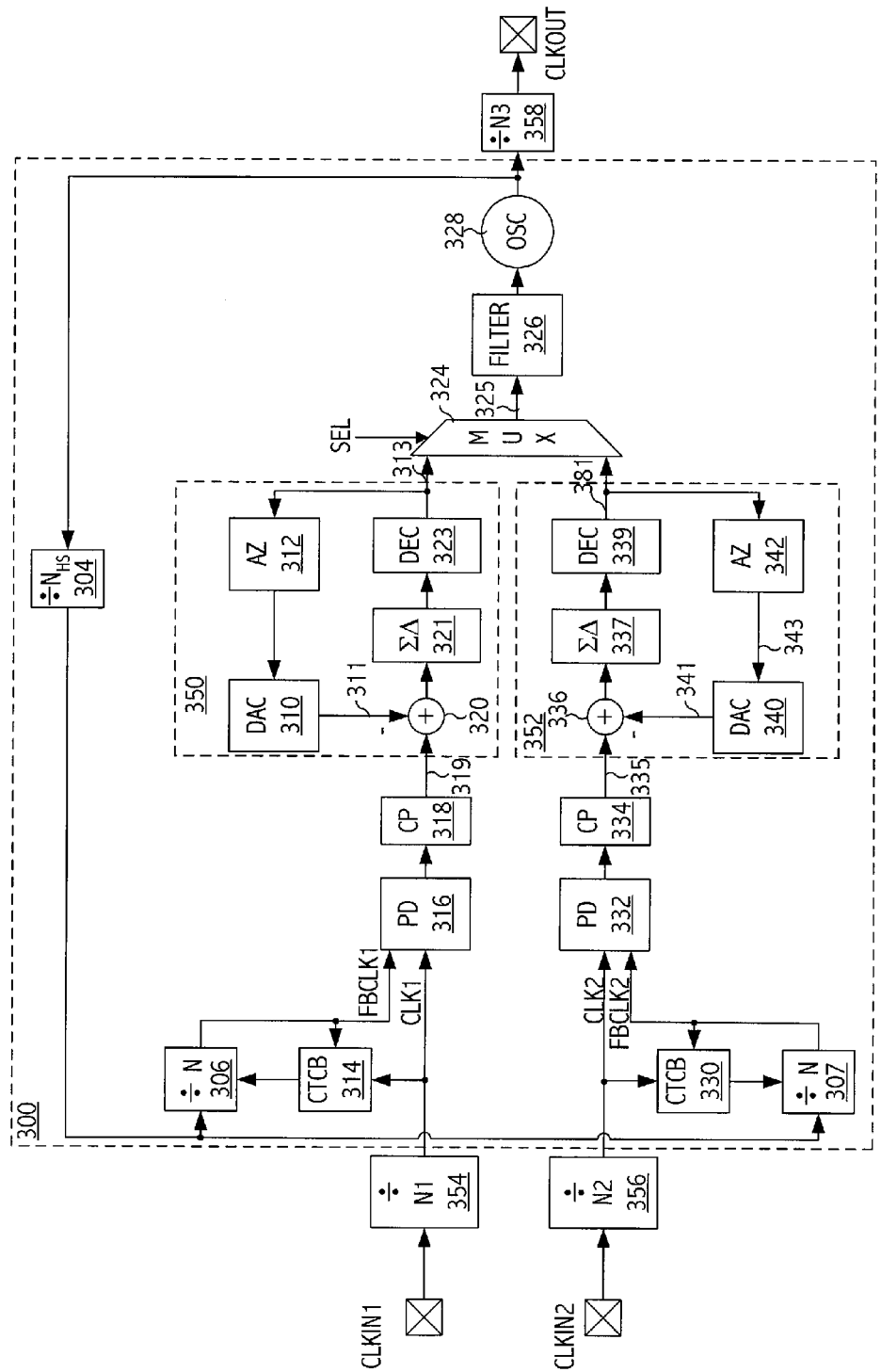
FIG. 3 illustrates a block diagram of exemplary portions of an integrated circuit including a PLL.

Unless compensation techniques are applied, when switching the reference clock signal of PLL 204 from CLK1 to CLK2, PLL 204 pulls the output clock signal to the phase of CLK2. Such a phase movement may result in undesirable glitches on CLKOUT. In some applications, such phase changes in CLKOUT can introduce transmission errors or other problems. However, by monitoring and storing an indicator of the phase difference between the selected input clock signal and any non-selected input clock signal, the indicator of the phase difference may be utilized to compensate for this difference. Referring to FIG. 3, PLL 300 includes phase detector circuits (e.g., phase detectors 316 and 332) for monitoring each input clock signal (e.g., input clock signals CLK1 and CLK2). Phase detector 316 monitors the phase difference between CLK1 and FBCLK1, which is a frequency divided version of the output of controllable oscillator 328 (e.g. by divider 304 and divider 306). Phase detector 332 monitors the phase difference between CLK2 and FBCLK2, which is a frequency divided version of the output of controllable oscillator 328 (e.g. by divider 304 and divider 307). Loop filter 326 and controllable oscillator 328 provide PLL functionality. In at least one embodiment of PLL 300, the output of controllable oscillator 328 is frequency divided by divide ratio N3 of divider circuit 358 to generate output clock signal CLKOUT.

Figure 4:
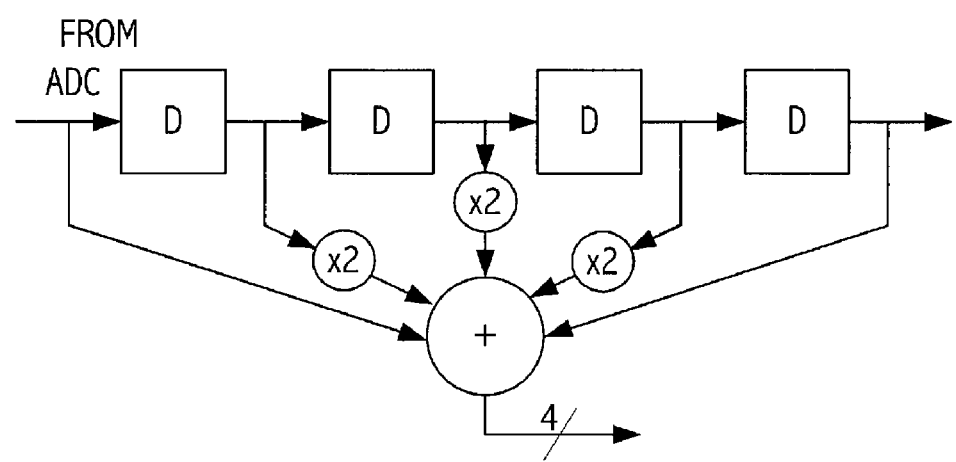
FIG. 4 illustrates a block diagram of an exemplary decimator/filter circuit utilized in at least one embodiment of the PLL of FIG. 3.

The operation of PLL 300 will be described with reference to CLK1 being the original input clock signal. A subsequent event (e.g., a change in the state of select signal SEL, which selects the output of multiplexer 324, signal 325, used to control controllable oscillator 328) switches the reference clock signal from input clock signal CLK1 to input clock signal CLK2. At the beginning of operation, input clock signals CLK1 and CLK2 are provided to phase detectors 316 and 332, respectively. While input clock signal CLK1 is selected as the input clock signal, auto-zero loop 350 is effectively open and DAC 310 is effectively disabled, i.e., DAC 310 provides at most a negligible value to summing node 320 on compensation signal 311. However, auto-zero loop 352 is effectively closed and functions to maintain the non-selected clock (e.g., input clock signal CLK2), combined with any required DC offset (e.g., phase-difference compensation signal 341), locked to FBCLK2 so that switching the reference clock signal between input clock signals may occur without undue phase transients or phase movement on CLKOUT. The analog-to-digital converter (e.g., sigma-delta ADC 337, or other suitable analog-to-digital converter) converts the analog phase-difference signal summed with the DC offset to a digital value that is provided to the decimator 339, which provides its output both to multiplexer 324 and auto-zero filter 342. Decimator 339 (and decimator 323 of auto-zero loop 350) may be implemented as decimator 507 shown in FIG. 4 or as another suitable decimator design.

In at least one embodiment of PLL 300, DAC 340 of auto-zero loop 352 (and DAC 310 of auto-zero loop 350) may include a plurality of current generation circuits (e.g., current sinks or current sources) that are selectively enabled to generate a DC current having a particular magnitude based on the phase difference between input clock signal CLK2 and feedback clock signal FBCLK2, which is locked to input clock signal CLK1. Auto-zero filter 342 (and auto-zero filter 312 of auto-zero loop 350) may be a low pass filter and DAC 340 may provide a DC offset signal (e.g., phase-difference compensation signal 341) to summing node 336. The DC offset signal is combined with the output of charge pump 334 to attenuate the phase-difference signal (e.g., phase-difference signal 335) based on the phase difference between the de-selected input clock signal (e.g., input clock signal CLK2) and the feedback clock signal (e.g., feedback clock signal FBCLK2), which is locked to the selected input clock signal (e.g., input clock signal CLK1). Thus, phase-difference signal 335 indicates the phase difference between input clock signal CLK1 and input clock signal CLK2. As referred to herein, phase build-out is the phase difference between a de-selected input clock signal (e.g., input clock signal CLK2) and the feedback clock signal (e.g., feedback clock signal FBCLK2), which is locked to the selected input clock signal (e.g., input clock signal CLK1). While input clock signal CLK1 is selected, auto-zero loop 352 locks, i.e., auto-zero loop 352 may periodically update a DAC control value for controlling the magnitude of a phase-difference compensation signal 341 to provide a DC signal having substantially the same magnitude of charge as provided by phase-difference signal 335. The DAC control value may be received from auto-zero filter 342 (e.g., control signal 343) and stored in DAC 340 or provided as an input to DAC 340 and stored external to DAC 340.

Upon an event switching the input clock signal that drives signal 325 from input clock signal CLK1 to CLK2 (e.g., by a change in the state of select signal SEL), auto-zero loop 352 disables updates of the DAC control value for controlling the magnitude of phase-difference compensation signal 341. The stored value is fixed at a value indicating the magnitude of the phase build-out. The stored value may be used as an offset to phase-difference signal 335, which indicates a phase difference between input clock signal CLK2 and the feedback clock signal FBCLK2, which is controlled by adjusting signal 325 according to this phase difference. The resulting signal, signal 381, is supplied to multiplexer 324 and used to control oscillator 328. Note that if PLL 300 is locked and auto-zero loop 352 is locked, both digital word inputs to multiplexer 324 (e.g., signal 313 and signal 381) are substantially equal to zero. Thus, upon the event switching the input clock signal that drives signal 325 from input clock signal CLK1 to CLK2, both digital words will be substantially equal to zero.

In at least one embodiment of PLL 300, coarse tune control blocks 314 and 330 may trigger adjustments to feedback clock signals FBCLK1 and FBCLK2, which are provided to phase detectors 316 and 332, respectively. Those clock signals may have phase differences from respective ones of CLK1 and CLK2 that are within a particular range. For example, coarse tune control blocks 314 and 330 control divider circuits 306 and 307, respectively, to "spit" or "swallow" a clock pulse, thus, effectively increasing or decreasing the phase difference by a discrete step when the magnitude of the phase difference is above a predetermined amount. Note that a discrete step phase adjustment may occur in the feedback path in at least one embodiment of PLL 300. The discrete step phase adjustment when the magnitude of the phase difference exceeds a predetermined amount also allows phase detectors 316 and 332 to operate in a relatively small region of their linear range.

Figure 5A:
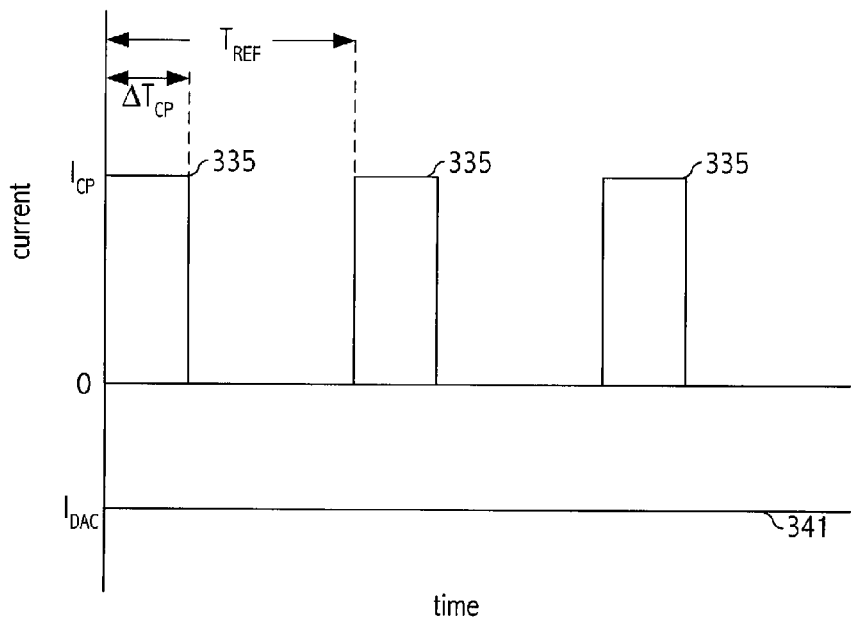
FIG. 5A illustrates waveforms consistent with exemplary signals of at least one embodiment of the PLL of FIG. 3.

Referring to FIG. 5A, in at least one embodiment of PLL 300, charge pump 334 provides phase-difference signal 335 as a pulsed signal. As referred to herein, a pulsed signal is a periodic pulse train of charge having a magnitude (e.g., $I_{CP}$), a pulse width (e.g., $\Delta T_{CP}$), and a period (e.g., $T_{REF}$, where frequency $f_{REF}=1/T_{REF}$). A pulsed signal varies in amplitude but does not vary sign during a particular period. A pulsed signal has an associated duty cycle of less than 100%. Note that although pulsed signals are illustrated herein as rectangular pulses that increase from a base level of zero amps to a maximum amplitude of $I_{CP}$ and return to the base level, other constant levels may be used as a base level, and other geometric shapes may define the pulse (e.g., square, triangular, or sinusoidal). In addition, the rise and fall times of the pulse may vary. Digital-to-analog converter 340 provides to summing node 336, phase-difference compensation signal 341, which is a DC signal having a magnitude (e.g., $I_{DAC}$) based on the magnitude of the phase build-out, determined prior to a switching event.

Figure 5B:
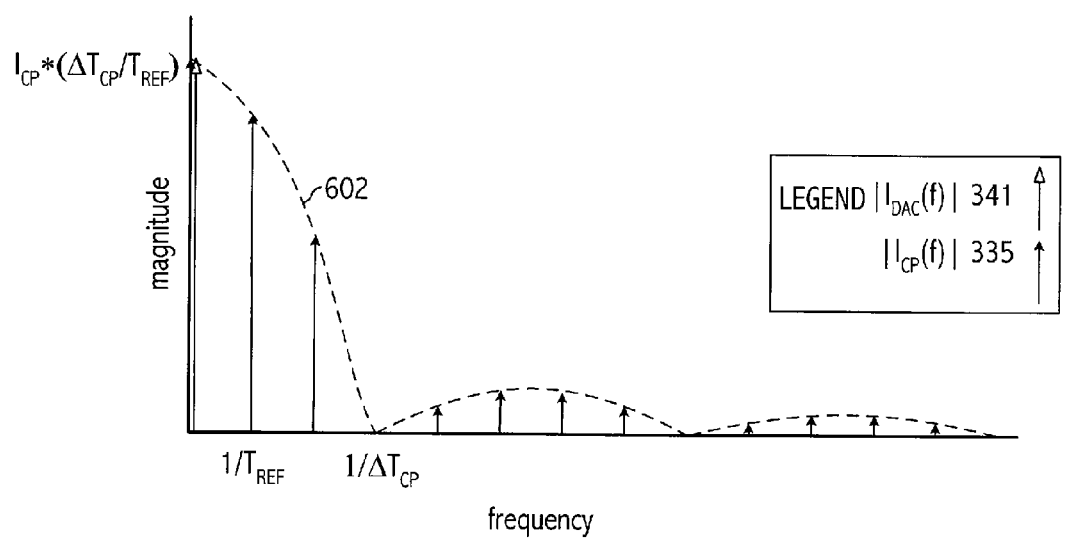
FIG. 5B illustrates a frequency response consistent with exemplary signals of at least one embodiment the PLL of FIG. 3.

Referring to FIG. 5B, the frequency response of phase-difference signal 335 is a periodic signal having a DC signal component in addition to higher frequency signal components. The frequency response of phase-difference signal 335, which is a periodic signal, is a train of impulses having magnitudes proportional to the discrete Fourier series (DFS) coefficients corresponding to samples of the Fourier transform of one period of phase-difference signal 335. The DFS coefficients correspond to samples equally spaced in frequency. In at least one embodiment of PLL 300, one period of phase-difference signal 335 is a rectangular pulse, which has a Fourier transform of $(\sin(x))/x$, i.e., a sinc function. Thus, the magnitude of the DFS coefficients are represented by equally spaced impulses having magnitudes characterized by a sinc function envelope (e.g., envelope 602). The separation of the impulses in the spectrum of phase-difference signal 335 is $1/T_{REF}$ and the zeros of the envelope of the spectrum occur at multiples of $1/\Delta T_{CP}$. Note that the time duration of an individual period of the signal ($T_{REF}$) and its spectral width (i.e., separation of impulses of the spectrum) are inversely proportional.

The DFS coefficient at DC of the spectrum of phase-difference signal 335 has a magnitude of $I_{CP} \times (\Delta T_{CP}/T_{REF})$. The DC component of phase-difference signal 335 may be sufficiently attenuated for a particular application by phase-difference compensation signal 341, which has substantially the same magnitude, but opposite sign, as the DC component of phase-difference signal 335. However, spur signals may remain after summing node 336. As referred to herein, a spur signal refers to an unwanted harmonic of a phase-difference signal, e.g., individual harmonics of phase-difference signals 335 and 319 of PLL 300 in FIG. 3. Note that phase-difference compensation signal 341 is a DC signal, but is shown in FIG. 5B slightly offset from 0 Hz for illustration purposes.

Referring back to FIG. 3, in at least one embodiment of PLL 300, spur signals are attenuated by low-pass filter 326 having a filter response with a low $f_{3dB}/f_{REF}$ ratio. However, in some applications, low-pass filter 326 should have a filter response with a $f_{3dB}/f_{REF}$ ratio equal to a particular ratio (e.g., 1/20) to achieve particular design goals. When $f_{REF}$ is a frequency that results in small frequency separation between impulses of the spectrum of phase-difference signal 335 (e.g., applications with lower $f_{REF}$), efficient filter designs that sufficiently attenuate spur signals may be difficult to achieve. In another embodiment of PLL 300, spur signals are attenuated by a notch filter that attenuates signals with a frequency of $f_{REF}$. A notch filter typically introduces a delay of ½ $T_{REF}$ into the PLL transfer function, which may introduce unacceptable jitter peaking in some applications.

Figure 6:
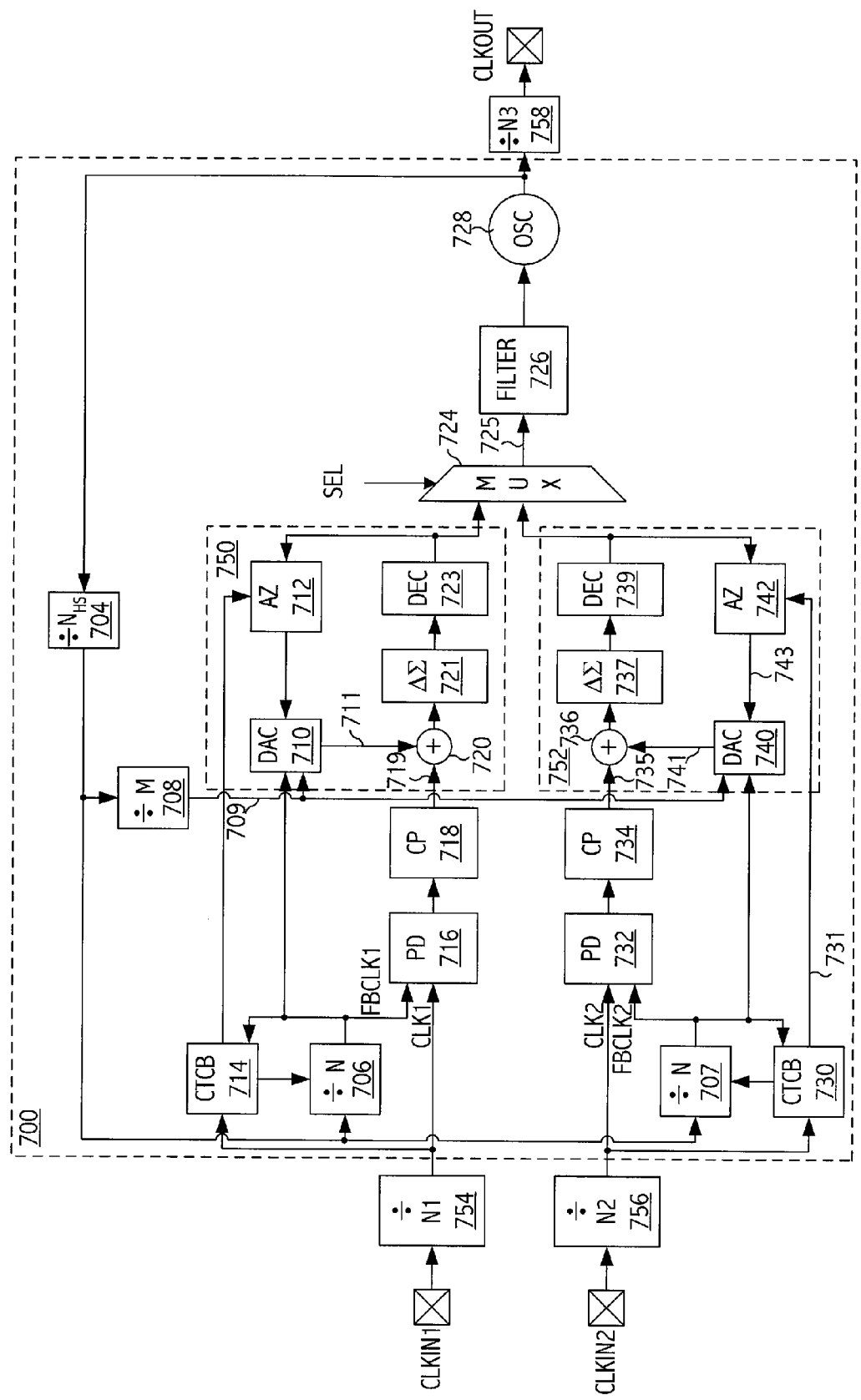
FIG. 6 illustrates a block diagram of exemplary portions of an integrated circuit including a PLL consistent with at least one embodiment of the invention.

Referring to FIG. 6, a technique for attenuating spur signals associated with phase-build out compensation is illustrated. In at least one embodiment, PLL 700 includes phase detector circuits (e.g., phase detectors 716 and 732) for monitoring each input clock signal (e.g., input clock signals CLK1 and CLK2). Phase detector 716 monitors the phase difference between CLK1 and FBCLK1. Phase detector 732 monitors the phase difference between CLK2 and FBCLK2. Loop filter 726 and controllable oscillator 728 provide PLL functionality. In at least one embodiment of PLL 700, the output of controllable oscillator 728 is frequency divided by divide ratio N3 of divider circuit 758 to generate output clock signal CLKOUT.

Similar to the operation of PLL 300, the operation of PLL 700 will be described with reference to CLK1 being the original input clock signal. A subsequent event (e.g., a change in the state of select signal SEL, which selects the output of multiplexer 724, signal 725, used to control controllable oscillator 728) switches the reference clock signal from input clock signal CLK1 to input clock signal CLK2. At the beginning of operation, input clock signals CLK1 and CLK2 are provided to phase detectors 716 and 732, respectively. While input clock signal CLK1 is selected as the input clock signal, auto-zero loop 750 is effectively open and DAC 710 is effectively disabled, i.e., DAC 710 provides at most a negligible value to summing node 720 on phase-difference compensation signal 711. However, auto-zero loop 752 is effectively closed and functions to maintain the non-selected clock (e.g., input clock signal CLK2), combined with any required phase-difference compensation signal (e.g., phase-difference compensation signal 741), locked to FBCLK2 so that switching between input clock signals may occur without undue phase transients or phase difference on CLKOUT. The analog-to-digital converter (e.g., delta-sigma ADC 737) converts the analog phase-difference signal summed with the DC offset to a digital value that is provided to the decimator 739, which in turn provides its output both to multiplexer 724 and auto-zero filter 742. Decimator 739 may be implemented as decimator 507 shown in FIG. 4 or as another suitable decimator design.

In at least one embodiment of PLL 700, auto-zero filter 742 may be a low-pass filter and DAC 740 may provide a phase-difference compensation signal (e.g., phase-difference compensation signal 741) to summing node 736. The phase-difference compensation signal is combined with the output of charge pump 734 (e.g., phase-difference signal 735) to attenuate the phase-difference contribution of the phase difference between the de-selected input clock signal (e.g., input clock signal CLK2) and the feedback clock signal (e.g., feedback clock signal FBCLK2), which is locked to the selected input clock signal (e.g., input clock signal CLK1). Thus, phase-difference signal 735 indicates the phase build-out between input clock signal CLK2 and feedback clock signal FBCLK2. While input clock signal CLK1 is selected, auto-zero loop 752 locks, i.e., auto-zero loop 752 may periodically update a DAC control value for controlling the magnitude of a phase-difference compensation signal 741 to provide a signal having substantially the same magnitude of charge as provided by phase-difference signal 735. While achieving lock of auto-zero loops 750 and 752, as described above, auto-zero loops 750 and 752 include control circuitry (not shown) that update corresponding DAC circuits 710 and 740 during inactive portions of the period of phase-difference compensation signals 711 and 741 (i.e., when phase-difference compensation signals 711 and 741 return to the base level). The respective DAC control value may be received from auto-zero filter 742 (e.g., via control signal 743) and stored in DAC 740 or provided as an input to DAC 740 and stored external to DAC 740.

Similar to PLL 300, upon an event switching the input clock signal that drives signal 725 from input clock signal CLK1 to CLK2 (e.g., by a change in the state of select signal SEL), auto-zero loop 752 disables updates of the DAC control value for controlling phase-difference compensation signal 741. Note that if PLL 700 is locked and auto-zero loop 752 is locked, both digital word inputs to multiplexer 724 (e.g., signal 713 and signal 781) are substantially equal to zero. Thus, upon the event switching the input clock signal that drives signal 725 from input clock signal CLK1 to CLK2, both digital words will be substantially equal to zero. In contrast to PLL 300, in at least one embodiment of PLL 700, phase-difference signals 719 and 735 and phase-difference compensation signals 711 and 741 are periodic pulse trains of charge, i.e., phase-difference signals 719 and 735 and phase-difference compensation signals 711 and 741 are pulsed signals. The periodicity of phase-difference compensation signals 711 and 741 introduces frequency components of phase-difference compensation signals 711 and 741 that are at frequencies other than DC.

In the description that follows, the behavior of charge pump 734 and elements of auto-zero loop 752 are described. Note that a similar description applies to charge pump 718 and elements of auto-zero loop 750. By configuring DAC 740 to provide a phase-difference compensation signal to have the same period as phase-difference signal 735 (e.g., a period of $T_{REF}$, corresponding to frequency $f_{REF}$), phase-difference compensation signal 741 includes frequency components having the same frequency separation as phase-difference signal 735. The frequency responses of phase-difference signal 735 and phase-difference compensation signal 741, include trains of impulses having magnitudes proportional to discrete Fourier series (DFS) coefficients corresponding to samples of the Fourier transform of one period of phase-difference signal 735 and compensation signal 741, respectively.

Figure 7A:
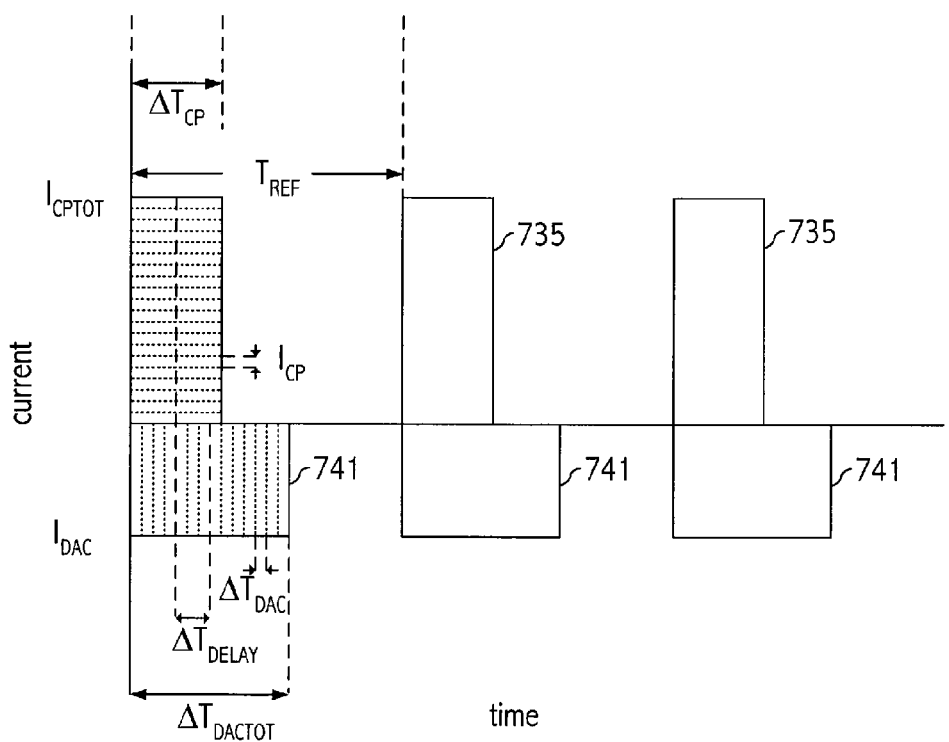
FIG. 7A illustrates waveforms consistent with exemplary signals of at least one embodiment of the PLL of FIG. 6.
Figure 7B:
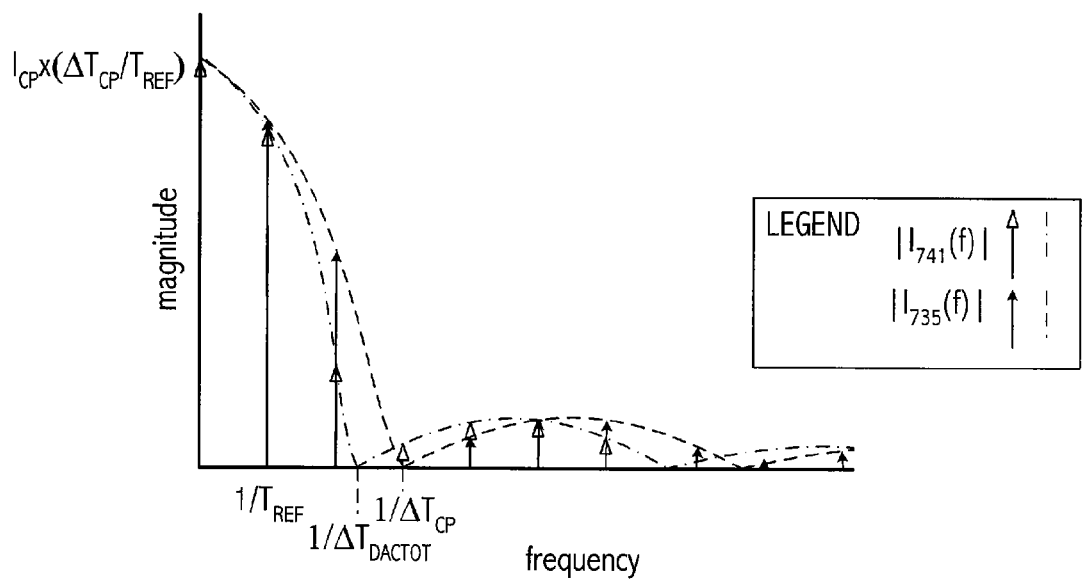
FIG. 7B illustrates a frequency response consistent with exemplary signals of at least one embodiment of the PLL of FIG. 6.

Referring to FIGS. 7A and 7B, ideal compensation of the phase build-out may be possible where the total pulse-width of the rectangular pulses of phase-difference signal 735 (e.g., $\Delta T_{CP}$), and the magnitude of those pulses (e.g., $I_{CPTOT}$, where $I_{CPTOT}=k \times I_{CP}$), are identical to the pulse-width of the rectangular pulses of phase-difference compensation signal 741 (e.g., $\Delta T_{DACTOT}$, where $\Delta T_{DACTOT}=L \times \Delta T_{DAC}$), and the magnitude of those pulses (e.g., $I_{DAC}$), respectively. However, sufficient compensation of the phase build-out may be achieved although phase-difference signal 735 and phase-difference compensation signal 741 having substantially different magnitudes and substantially different duty cycles. In at least one embodiment of PLL 700, charge pump 734 and DAC 740 generate substantially equivalent values of $I_{CPAVG}$ and $I_{DACAVG}$, respectively, e.g., by generating pulses having substantially different magnitudes and substantially different durations, and $\Delta T_{CP}$ and $I_{CPTOT}$ substantially differ from $\Delta T_{DACTOT}$ and $I_{DAC}$, respectively.

For example, in at least one embodiment of PLL 700, charge pump 734 generates k units of DC current $I_{CP}$, each unit being $\Delta T_{CP}$ wide and updated each $T_{REF}$. Thus, the average current of phase-difference signal 735 over one period $T_{REF}$ is:

$$I_{CPAVG} = k \times I_{CP} \times \frac{\Delta T_{CP}}{T_{REF}} = k \times I_{CP} \times \Delta T_{CP} \times f_{REF}.$$

Digital-to-analog converter 740 generates L units of DC current $I_{DAC}$, each unit being $\Delta T_{DAC}$ wide and updated each $T_{REF}$. The average current of phase-difference compensation signal 741 over one period $T_{REF}$ is:

$$I_{DACAVG} = L \times I_{DAC} \times \frac{\Delta T_{DACTOT}}{T_{REF}} = L \times I_{DAC} \times \Delta T_{DACTOT} \times f_{REF}.$$

If $\Delta T_{DAC}$ is generated based on the frequency of the output of controllable oscillator 728, $f_{CO}$, e.g., $\Delta T_{DACTOT}=M \times N_{HS}/f_{CO}$, where M is the divide value of divider 708 and $N_{HS}$ is the divide value of divider 704, then $$I_{DACAVG} = L \times I_{DAC} \times \frac{MN_{HS}}{f_{CO}} \times f_{REF}.$$

Over one period of $T_{REF}$, a total magnitude of charge delivered by phase-difference signal 735 to summing node 736 is substantially equivalent to a total magnitude of charge carried away from summing node 736 by phase-difference compensation signal 741. Note that by equating $I_{CPAVG}$, which is proportional to $f_{REF}$, to $I_{DACAVG}$, which is also proportional to $f_{REF}$, the resulting relationship between $I_{CPAVG}$ and $I_{DACAVG}$ is independent of the frequency of the input clock signals:

$$k \times I_{CP} \times \Delta T_{CP} \times f_{REF} = L \times I_{DAC} \times \frac{MN_{HS}}{f_{CO}} \times f_{REF},$$

which becomes $$k \times I_{CP} \times \Delta T_{CP} = L \times I_{DAC} \times \frac{MN_{HS}}{f_{CO}}.$$

Note that because relationship between $I_{CPAVG}$ and $I_{DACAVG}$ is independent of $f_{REF}$, the relationship between $I_{CPAVG}$ and $I_{DACAVG}$ may be maintained across implementations having respective values for $f_{REF}$ that span several orders of magnitude.

Similar to k of charge pump circuit 734, the number of units of DC current generated by DAC 740, L, may be fixed or programmable. For example, k, divider values M, N, and $N_{HS}$, and L may be provided to PLL 700 from off-chip or may be determined (e.g., from configuration table 206 of FIG. 1) based on parameters including input signal frequency, target PLL bandwidth, and target output signal frequency, which may be provided to PLL 700 from off-chip. The number of units L, may be determined:

$$L = k \times I_{CP} \times \frac{N_{HS}}{f_{CO}} \times \frac{1}{I_{DAC} \times \frac{M \times N_{HS}}{f_{CO}}} = \frac{k \times I_{CP}}{M \times I_{DAC}}.$$

The magnitude of the units, $I_{DAC}$, is based at least in part on the DAC control value 743, which is determined by auto-zero loop 752 based on the duration of a pulse delivered by the pulsed output of charge pump 734 during a period $T_{REF}$. Note that L may be determined based on division of a target range by a target resolution of the phase build-out compensation introduced by DAC 740. For example, a target range of 5 ns and a target resolution of 100 ps, may be achieved by setting L to 50 or greater. However, L may be implemented using six bits plus a sign bit, which is $+/-2^6=+/-64$, which includes some margin to account for offsets or other non-idealities in the implementation of PLL 700. Although a phase-difference compensation technique may equate $\Delta T_{CP}$ and $I_{CPTOT}$ to $\Delta T_{DACTOT}$ and $I_{DAC}$, respectively, sufficient compensation of the phase build-out may also be achieved by other implementations of charge pump 734 and DAC 740 that generate substantially equivalent values of $I_{CPAVG}$ and $I_{DACAVG}$ during a period $T_{REF}$.

The bandwidth of auto-zero loop 752 determines the rate at which auto-zero loop 752 achieves lock (e.g., settles on a value for the DAC control value). In at least one embodiment of auto-zero loop 752, the bandwidth of auto-zero loop 752 is much less than $f_{REF}$. The bandwidth of auto-zero loop 752 may be adjustable e.g., by configuring auto-zero loop 752 based on parameters in a table. Note that because the DAC control value is limited to discrete values, the least significant bits of the DAC control value may toggle between two values although auto-zero loop 752 is locked. In at least one embodiment of PLL 700, the auto-zero loop bandwidth is set to approximately 1 kHz.

In at least one embodiment of PLL 700, $\Delta T_{CP}$ is bounded. For example, coarse tune control blocks 714 and 730 may provide clock signals to phase detectors 716 and 732, respectively. Those clock signals may be versions of input clock signals CLK1 and CLK2 that have a phase difference from a feedback clock signal (e.g.,FBCLK1 or FBCLK2) that is within a particular range (e.g., 2.5 ns). In at least one embodiment of PLL 700, coarse tune control blocks 714 and 730 may control divider circuits 706 and 707, respectively, to spit/swallow a pulse. For example, coarse tune control block 714 may control divider circuit 706 to spit or swallow one period (i.e., $1/(f_{CO}/N_{HS})$) every $T_{REF}$. In at least one embodiment of PLL 700, if the phase difference between an input clock signal and the feedback clock signal is greater than a predetermined value, PLL 700 steps at a high frequency (e.g., a frequency in the GHz range) until the feedback clock signal is aligned to the input clock signal. In at least one embodiment of PLL 700, coarse tune control block 703 triggers an auto-align function that aligns input clock signal CLK1 and feedback clock signal FBCLK1 within a first range, followed by a coarse tune spit or swallow to align input clock signal CLK1 and feedback clock signal FBCLK1 within a second, narrower range, within the first range (e.g., input clock signal CLK1 is within 2.5 ns of an edge of feedback clock signal FBCLK1, thus the range of the phase difference on the input of the auto-zero loop is 2×2.5 ns=5 ns). Accordingly, $$\Delta T_{CPMAX} = \frac{N_{HS}}{f_{CO}} \equiv \Delta T_{CT},$$

i.e., a coarse tune auto-zero step size, where $\Delta T_{CT}$ is the resolution of a coarse tune function that is applied to input clock signals CLK1 and CLK2 prior to phase detectors 716 and 732 and $N_{HS}$ creates the coarse tune step size. Note that by substituting $\Delta T_{CT}$ for $\Delta T_{CPMAX}$, which is inversely proportional to $f_{CO}$, the resulting relationship is independent of the output frequency of the controllable oscillator, $f_{CO}$:

$$k \times I_{CP} \times \frac{N_{HS}}{f_{CO}} = L \times I_{DAC} \times \frac{MN_{HS}}{f_{CO}},$$

which becomes $$k \times I_{CP} = L \times I_{DAC} \times M.$$

Thus, the ratio of charge provided by $I_{CP}$ and $I_{DAC}$ is fixed with respect to changes in $f_{CO}$ and the accuracy of DAC 740 is independent of $f_{CO}$. DAC 740 may compensate for phase build-out components of phase-difference signal 735 for a wide range of feedback clock frequencies (e.g., $f_{REF}$, the frequency of FBCLK1, which is substantially the same as the frequency of FBCLK2) and for a wide range of controllable oscillator output frequencies (e.g., $f_{CO}$, the frequency of the signal generated by controllable oscillator 728). Accordingly, the number of DAC units may be determined, thus determining the range of phase build-out cancellation:

$$L_{MAX} = \frac{I_{CP}}{I_{DAC}} \times \frac{k_{MAX}}{M}.$$

Note that the value of $L_{MAX}$ may be chosen to include margin to account for offsets or other practical deviations from the model.

As referred to herein, the range of a phase-difference compensation circuit, e.g., DAC 740 of auto-zero loop 752, is the total amount of phase difference input-referred offset compensation that the phase-difference compensation circuit can provide. In addition, as referred to herein, the resolution of a phase-difference compensation circuit is the smallest amount of input-referred offset that the phase-difference compensation circuit can distinguish. For example, PLL 700 may be configured such that controllable oscillator 728 generates a signal having $f_{CO}$ equal to 5.12 GHz, charge pump 718 generates units of current that are 100 μA per unit, DAC 740 generates units of current that are 5 μA per unit (i.e., $I_{CP}/I_{DAC}$=20), the number of active $I_{CP}$ units, k, is 20, the divide ratio that determines the maximum on-time of DAC 740, M, is $2^3$=8, the divide value, N, of dividers 706 and 707 is $2^8$=256, and the divide value, $N_{HS}$, of high-speed divider 704 is 4. Based on this configuration, $f_{REF}$ is 5 MHz and $L_{MAX}$ is 50. By choosing $L=2^6=64$ as the number of DAC units, a slightly higher range of phase build-out cancellation is implemented, which may reduce the influence of offsets introduced by process, voltage, and/or temperature variations. Accordingly, the range and resolution of the phase build-out compensation introduced by DAC 740 (i.e., fine tune phase build-out compensation of auto-zero loop 752) are:

$$\begin{aligned}
\text{range} &\equiv \Delta T_{FTMAX} \\
&= \Delta T_{DACMAX} \\
&= L \times I_{DAC} \times \frac{M \times N_{HS}}{f_{CO}} \times \frac{1}{k \times I_{CP}} \\
&= \pm 1 \text{ ns}
\end{aligned}$$

and $$\begin{aligned}
\text{resolution} &\equiv \Delta T_{FTMIN} \\
&= \Delta T_{DACMIN} \\
&= I_{DAC} \times \frac{M \times N_{HS}}{f_{CO}} \times \frac{1}{k \times I_{CP}} \\
&\approx \pm 16 \text{ ps}.
\end{aligned}$$

Note that in at least one embodiment of PLL 700, the resolution and range of auto-zero loop 752 are independent of $f_{REF}$. In addition, the resolution and range of auto-zero loop 752 are independent of the number of units of $I_{CP}$, i.e., k, since the ratio of M and k is held constant. Thus, PLL 700 includes a flexible design for detecting phase differences and for compensating for the phase build-out. However, if twice the number of active charge pump units are used, i.e., 2×k=40, to maintain the range of DAC 740 at 1 ns, the divide ratio, M, may be doubled. Rather, if N=2$^{12}$ to obtain a different frequency for f$_{REF}$, e.g., 5.12 GHz/(4×2$^{12}$)=312.5 kHz, the average charge pump current becomes:

$$I_{CPAVG}=20\times100\ \mu A\times1\ ns\times312\ kHz=62.5\ nA.$$

Note that although in the discussions herein f$_{CO}$ is treated as being stable, f$_{CO}$ may vary by +/−10% or greater.

In at least one embodiment of the invention, PLL 700 is configured to compensate for phase differences at the inputs of phase detector 732 of approximately 5 ns. For example, charge pump 718 generates units of current that are 33.3 μA per unit, DAC 740 generates units of current that are 1.67 μA per unit (i.e., I$_{CP}$/I$_{DAC}$=20). The number of DAC units, L is 64. Thus, the resolution of the auto-zero loop then becomes 5 ns/L=5 ns/64≈80 ps. Such an embodiment may be achieved where the output frequency of the controllable oscillator, f$_{CO}$, is 5 GHz, the divide value of divider 708, M, is 4, the number of units of DC current I$_{CP}$, k, is 2, and the divide value N$_{HS}$ is 4. Another embodiment that achieves the same resolution is configured such that f$_{CO}$, is 5 GHz, M is 16, k is 16, and N$_{HS}$ is 4.

Referring to FIGS. 7A and 7B, in at least one embodiment of PLL 700, the output of charge pump 734, i.e., phase-difference signal 735, is a periodic pulse train of charge having magnitude I$_{CPTOT}$, pulse width of ΔT$_{CP}$, and period of T$_{REF}$. The output of DAC 740, i.e., phase-difference compensation signal 741, is a periodic pulse train of charge having magnitude I$_{DAC}$, pulse width of ΔT$_{DACTOT}$, and period of T$_{REF}$. Upon locking auto-zero loop 752, the phase build-out is a substantially fixed phase.

The frequency response of phase-difference signal 735 is a periodic signal having a DC signal component in addition to higher frequency signal components. The frequency response of phase-difference signal 735, which is a periodic signal, is a train of impulses having magnitudes proportional to the DFS coefficients corresponding to samples of the Fourier transform of one period of phase-difference signal 735. When the PLL is locked, the DFS coefficients of phase-difference signal 735 may be expressed as:

$$a_k = \frac{I_{CPTOT}\times\sin(k\times2\pi\times f_{REF}\times\Delta T_{CP}/2)}{k\times\pi}$$

Similarly, when the auto-zero loop 752 is locked, the DFS coefficients of phase-difference compensation signal 741 may be expressed as:

$$a_m = \frac{I_{DAC}\times\sin(m\times2\pi\times f_{REF}\times\Delta T_{DACTOT}/2)}{m\times\pi}\times e^{-T_{DELAY}(j\times2\times\pi\times m\times f_{REF})},$$

where T$_{DELAY}$ is the delay from the center of a pulse of the phase-difference signal 735 to the center of a corresponding pulse of phase-difference compensation signal 741. The DFS coefficients correspond to samples equally spaced in frequency. In at least one embodiment of PLL 700, one period of phase-difference signal 735 is a rectangular pulse, which has a Fourier transform of (sin(x))/x, i.e., a sinc function. Thus, the magnitude of the DFS coefficients are equally spaced impulses having magnitudes characterized by a sinc function envelope. The separation of the impulses in the spectra is 1/T$_{REF}$ and the zeros of the envelope of the spectrum occur at 1/ΔT$_{CP}$. Note that the time duration of an individual period of the signal (T$_{REF}$) and its spectral width (i.e., separation of impulses of the spectra) are inversely proportional.

The DFS coefficient of phase-difference signal 735 at DC has a magnitude of I$_{CP}$×(ΔT$_{CP}$/T$_{REF}$). The DC component of phase-difference signal 735 may be effectively offset by phase-difference compensation signal 741, which ideally has the same magnitude as the DC component of phase-difference signal 735 as a result of locking auto-zero loop 752. The DC components of these signals, i.e., where k=m=0, are:

$$a_{k=0}=I_{CPTOT}\times f_{REF}\times\Delta T_{CP},$$

and $$a_{m=0}=I_{DAC}\times f_{REF}\times\Delta T_{DACTOT}.$$

When PLL 700 is active and locked, a$_{k=0}$=a$_{m=0}$, thus, $$\Delta T_{DACTOT}=\frac{I_{CPTOT}}{I_{DAC}}\times\Delta T_{CP}$$

and $$a_m=$$

$$\frac{I_{DAC}\times\sin\left(m\times2\times\pi\times f_{REF}\times\frac{I_{CPTOT}}{I_{DAC}}\times\frac{\Delta T_{CP}}{2}\right)}{m\times\pi}\times e^{-T_{delay}(j\times2\times\pi\times m\times f_{REF})}.$$

In addition to attenuating the DC component of the phase-difference signal 735, phase-difference compensation signal 741 also attenuates spurs associated with phase-difference signal 735. Typically, DAC 740 will not know the exact width of I$_{CPTOT}$ pulse (e.g., due to leakage current and device mismatches), so the I$_{DACAVG}$ may not equal I$_{CPAVG}$ exactly. In at least one embodiment of PLL 700, matching of I$_{DACAVG}$ to I$_{CPAVG}$ results in an offset referred to the input of the phase detectors of 80 ps. Although phase-difference compensation signal 741 may not be exactly equal and opposite to phase-difference signal 735 (e.g., due to the different magnitudes and widths of individual pulses of phase-difference signal 735 and phase-difference compensation signal 741 and the resulting difference in the spectra corresponding to those signals) sufficient attenuation of spurs may be achieved. The magnitude of the signal spur attenuation at the fundamental frequency (i.e., f$_{REF}$) may be represented as:

$$20\times\frac{\log_{10}(a_{k=1}-a_{m=1})}{a_{k=1}}dBc,$$

where dBc is decibels relative to the carrier current. In at least one embodiment of PLL 700, spur signal attenuation is in the range of 10-50 dBc, relaxing requirements for filter 726. Additional attenuation of any remaining spur signals occurs in other circuits of PLL 700. Upon switching the reference clock signal from input clock signal CLK1 to input clock signal CLK2, the inputs to phase detectors 716 and 732 have a maximum phase difference of approximately 2.5 ns and the output of auto-zero loops 750 and 752 have a maximum phase difference of approximately 200 ps, which may be reduced by other circuits of PLL 700.

Figure 8:
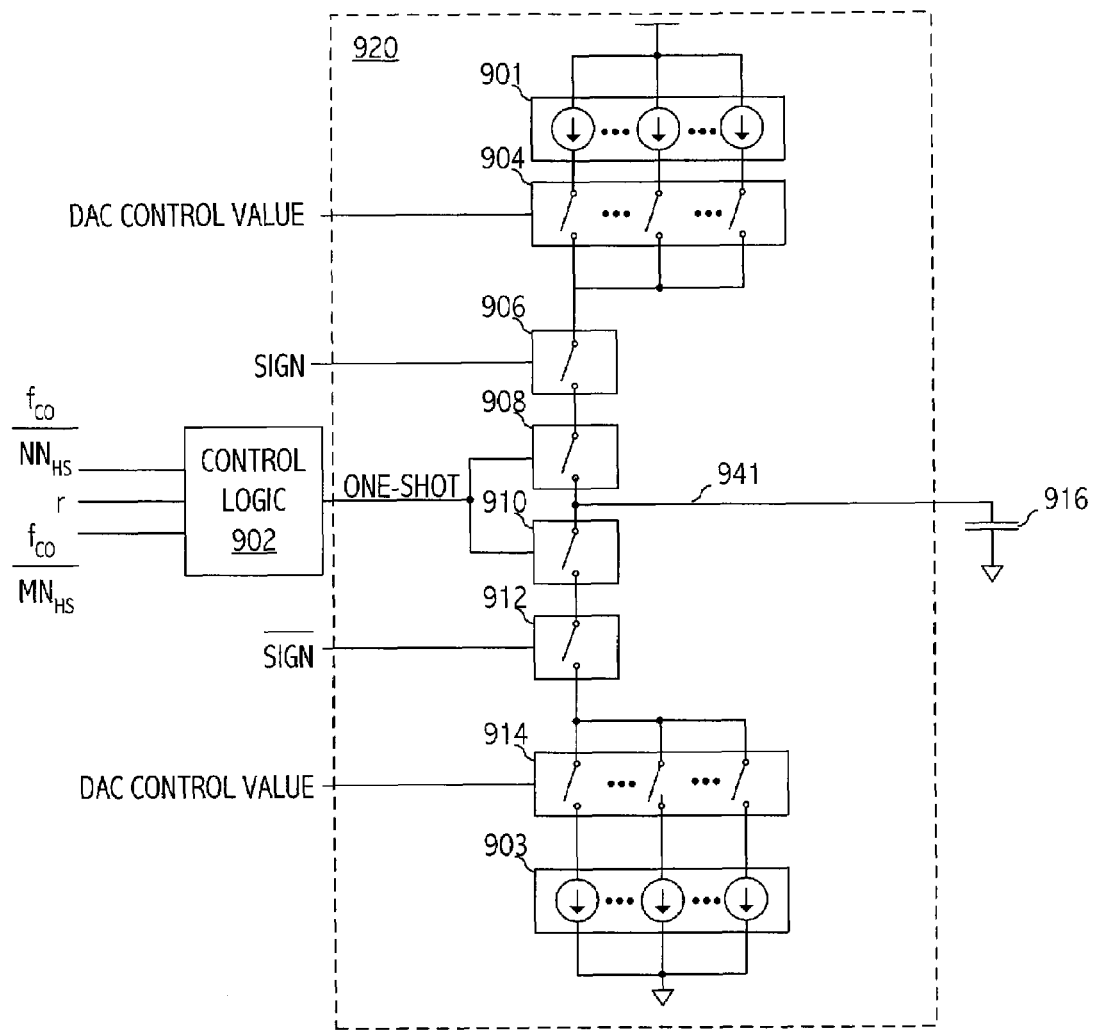
FIG. 8 illustrates a block diagram of an exemplary digital-to-analog converter (DAC) circuit consistent with at least one embodiment of the invention.
Figure 9:
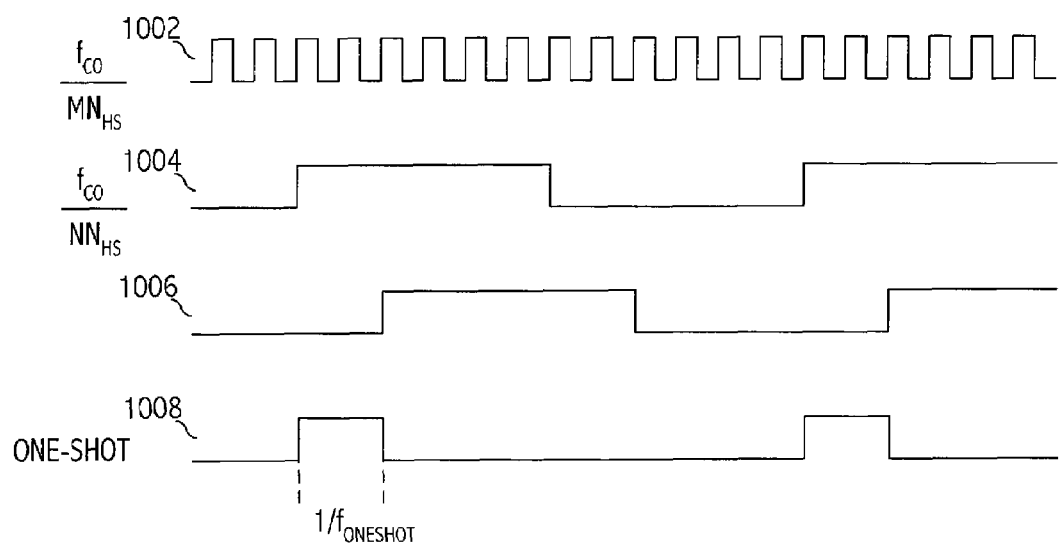
FIG. 9 illustrates waveforms consistent with exemplary signals of at least one embodiment of the DAC circuit of FIG. 8.

In at least one embodiment of PLL 700, DAC 740 includes at least one "one-shot" circuit, i.e., a circuit that produces an output pulse of a particular duration whenever it receives a particular edge of an input clock signal. For example, DAC 740 may be implemented by the DAC illustrated in FIG. 8, which includes control logic 902 that generates a one-shot signal (e.g., ONE-SHOT). The one-shot signal is digitally programmable based on two clock signals and a pulse width indicator, which in at least one embodiment of PLL 700 are: the output of divider 706 (e.g., $f_{CO}/(N \times N_{HS})$), which is illustrated by exemplary waveform 1004), the output of divider 708 ($f_{CO}/(M \times N_{HS})$), which is illustrated by exemplary waveform 1002), and the number of units of $I_{DAC}$, L. The value of M is much less than the value of N. The one-shot signal may be generated using a version of the output of divider 706 delayed by r cycles of the output of divider 708 to generate an intermediate signal, which is illustrated by exemplary waveform 1006 for a value of r=2 and N/M=6. The value of r may be determined based on parameters including input signal frequency and target PLL bandwidth (e.g., from a configuration table). The complement of the delayed version may then be logically ANDed with the output of divider 706 to generate the one-shot signal, which is a pulse of duration $1/f_{ONESHOT}$ (e.g., $\Delta T_{DACTOT}$ of FIG. 7A), which is r periods of the output of divider 708, the pulse periodically repeating with the same period and phase as the output of divider 706. In at least one embodiment of PLL 700, control logic 902 generates the one-shot signal using typical circuits, e.g., delay elements, counter(s), multiplexer(s), AND gates, inverter(s), comparator(s), etc.

Referring back to FIG. 7, in at least one embodiment of DAC 740, the minimum, non-zero, pulse width of the one-shot circuit output, i.e., $1/f_{ONESHOTMIN}$ (e.g., $\Delta T_{DAC}$ of FIG. 7A), is the period of signal 709, i.e., $(M \times N_{HS})/f_{CO}$, and the pulse width of phase-difference compensation signal 741 may be increased in increments of $(M \times N_{HS})/f_{CO}$. Note that signal 709 is a substantially higher frequency signal than FBCLK1 or FBCLK2, i.e., the divide value of divider 708, M, is much less than, N, the divide value of dividers 706 and 707, (M<<N). For example, M may be 8 and N may be 256. The magnitude of the output of the one-shot circuit having the minimum, non-zero, pulse width may be determined according to the amount of charge required to compensate for a minimum, non-zero, amplitude output of charge pump 734 (e.g., $I_{CP} \times \Delta T_{CP}$). In at least one embodiment of PLL 700, rather than using a constant value for M and creating the one-shot signal using control logic 902, the one-shot signal is generated based on a value of M that is determined according to parameters including input signal frequency and target PLL bandwidth (e.g., from configuration table 206 of FIG. 1).

The one-shot signal controls switches 908 and 910 of circuit 920 to provide pulsed signal 941 (e.g., phase-difference compensation signal 741 or phase-difference compensation signal 711) having pulses of appropriate frequency and duration to summing integrator 916 (e.g., integrator included in ADC 737 or ADC 721). Circuit 920 is illustrated as a single-ended circuit, with PMOS based current sources and sinks, however, circuit 920 may be implemented by any suitable differential circuit. The magnitude of pulsed signal 941 is determined by the number and magnitudes of selectively enabled current sources 901 or the number and magnitudes of selectively enabled current sinks 903. A control signal, e.g., DAC CONTROL VALUE, which may be DAC control signal 743 from auto-zero filter 742 of auto-zero loop 752 or a decoded version of DAC control signal 743, controls switches 904 to enable an appropriate set of current sources or current sinks to provide a pulsed signal 941 with a magnitude sufficient to compensate for the phase build-out of phase-difference signal 735, as described above. In at least one embodiment of PLL 700, a most-significant bit of DAC CONTROL VALUE is a sign bit (e.g., SIGN), which determines the polarity of the pulse. For example, when the sign bit is high, selected ones of current sources 901 provide current to summing integrator 916 (i.e., pulsed signal 941 is a positive pulse). When the sign bit is low, selected ones of current sources 903 sink current from summing integrator 916 (i.e., pulse signal 941 is a negative pulse). Thus, pulsed signal 941 is synchronized to $f_{CO}/(N \times N_{HS})$, i.e., pulsed signal 941 has the same frequency and phase as $f_{CO}/(N \times N_{HS}) = f_{REF}$. The magnitude of pulsed signal 941 is based on DAC control signal 743, which is based on phase-difference signal 735. Note that increases in duration of the pulses associated with phase-difference signal 735 result in increases in magnitude of the phase-difference compensation signal 741 (e.g., by increasing the number of active $I_{DAC}$ units).

In at least one embodiment of PLL 700, DAC CONTROL VALUE is a 7-bit word. The most significant bit of DAC CONTROL VALUE is the sign bit. Current sources 901 includes six binary-weighted current sources of relative magnitudes 1×, 2×, 4×, 8×, 16×, and 32×. Current sinks 903 includes six current sinks of relative magnitudes 1×, 2×, 4×, 8×, 16×, and 32×.

Referring back to FIG. 7, in at least one embodiment of PLL 700, coarse tune control block 730 feeds forward control information (e.g., to auto-zero filter 742 via signal 731) to adjust the DAC control value. For example, in response to a coarse tune spit or swallow adjustment that occurs right before a channel switch, auto-zero filter 742 changes the DAC control value by an amount that corresponds to a period of the coarse tune spit or swallow. The change to the DAC control value occurs prior to the channel switch. Thus, auto-zero loop 752 effectively remains locked after a coarse tune spit or swallow. As referred to herein, the accuracy of a phase-difference compensation circuit (e.g., auto-zero loop 752) is how well the change to the DAC control value matches the coarse tune period, as referred to the phase detector inputs. Note that the change to the DAC control value and the accuracy of phase-difference compensation circuit are independent of $f_{REF}$ since $I_{CPAVG}$ and $I_{DACAVG}$ are designed to be equal and the relationship between $I_{CPAVG}$ and $I_{DACAVG}$ is independent of $f_{REF}$, as described above. Thus, the accuracy of the phase-difference compensation circuit is limited by manufacturing technology, e.g., the ability to match devices that form PLL 700. Mismatches between the coarse tune step of the charge pump current and the coarse tune step of the DAC control value referred to the phase detector inputs may result in phase movement at the PLL output prior to auto-zero loop 752 achieving lock. If auto-zero loop 752 has achieved lock, mismatches are removed by auto-zero loop 752 and phase movement at the PLL output would be determined by the resolution of DAC 740 referred to the phase detector inputs.

In at least one embodiment of PLL 700 at least one or all of parameters k, L, r, $f_{ONESHOT}$, M, N, $N_{HS}$, $f_{CO}$, $I_{CP}$, $I_{DAC}$ are determined based on at least some parameters such as input signal frequency, target PLL bandwidth, and target output signal frequency, which are provided to an integrated circuit including PLL 700 from off-chip. Referring to FIGS. 10A-E, in at least one embodiment of PLL 700, parameters k, L, r, $f_{ONESHOT}$, M, N, $N_{HS}$, $f_{CO}$, $I_{CP}$, $I_{DAC}$ are determined according to relationships described above and particular values of input signal frequency, target PLL bandwidth, and target output signal frequency and stored as table entries in non-volatile memory, or other suitable storage circuits, which may be indexed based on input signal frequency, target PLL bandwidth, and target output signal frequency. However, parameters k, L, r, $f_{ONESHOT}$, M, N, $N_{HS}$, $f_{CO}$, $I_{CP}$, $I_{DAC}$ may be fixed or set by other suitable techniques. In at least one embodiment of PLL 700, the frequency of the reference clock signal at the input of phase detectors 716 and 732 may span three orders of magnitude, e.g., the reference clock signal may have a frequency in the range of 2 kHz to 2 MHz. PLL 700 is versatile enough to meet phase transient specifications (e.g., within approximately 200 ps) although the input clock signal is switched between input clock signals, and the phase difference between input clock signals may span many orders of magnitude in time for the same percentage of a unit interval.

Exemplary parameter values for particular $f_{REF}$ and particular bandwidths of PLL 700 of FIG. 10A, are illustrated in corresponding entries of FIGS. 10B-10E. For example, by specifying to an integrated circuit including PLL 700 a selected configuration for PLL 700 including a particular $f_{REF}$ and a particular PLL bandwidth (e.g., $f_{REF}$ of approximately 256 kHz and PLL bandwidth of approximately 120 Hz where $f_{CO}$ is +/−10% around 5.3 GHz) PLL 700 may be configured from tables stored in non-volatile memory, e.g., N is approximately 20000 (FIG. 10B), k is approximately 8 for $I_{CP}$ of 33.3 μA per unit (FIG. 10C), $f_{ONESHOT}$ is approximately 78 MHz (FIG. 10D), a default fine auto-zero loop bandwidth, used to adjust auto-zero filters 712 and 742, is approximately 2.1 MHz (FIG. 10E). Similarly, the value of $N_{HS}$ may vary from 4 to 11 depending on the selected $f_{REF}$, PLL bandwidth, and a selected output frequency. The configured PLL 700 meets phase transient specifications although the input clock signal is switched between input clock signals.

Note that the tables illustrated in FIGS. 10A-E are exemplary and may differ for different application. In addition, other parameters may be loaded to configure PLL 700. For example, if ADC 721 and 737 provide feedback currents to corresponding nodes 720 and 736, ADC 721 and 737 may be configured to provide particular feedback currents based on parameters indexed from a table according to the selected $f_{REF}$ and PLL bandwidth. In addition, characteristics of phase detectors 716 and 732 may be configured based on parameters in a table indexed according to the selected $f_{REF}$ and PLL bandwidth. In general, techniques described herein may apply to any frequency range of the reference clock signal. However, a target manufacturing technology in which PLL 700 is realized may define limits on an actual range of the reference clock signal, e.g., the magnitudes of leakage currents as compared to magnitudes of signal currents may limit the realized range of the reference clock signal in a complementary metal oxide semiconductor process.

Another technique for compensating phase build-out may perform an auto-zero function by introducing delays to the input clock signal and the feedback signal via phase interpolation circuitry or other suitable technique, prior to the phase detector circuits to align the inputs to the phase detectors. When the delay circuitry is being adjusted, $I_{CP}$ of phase-difference signal 735 would be non-zero. However, when the delay circuitry achieves a stable condition, the $I_{CP}$ of phase-difference signal 735 would be approximately zero (e.g., within jitter specifications). A technique for phase build-out compensation includes performing an auto-zero function in the digital domain, e.g., at the output of decimators 723 and 739. In addition, although auto-zero loop 752 determines phase-difference compensation signal 735 based on input clock signal CLK2 and feedback signal FBCLK2 while feedback signal FBCLK2 is locked to input clock signal CLK1, in at least one embodiment of PLL 700, phase-difference compensation signal 735 is generated based on directly determining the phase difference between input clock signals CLK1 and CLK2.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment in which hitless switching is performed between two input clock signals, one of skill in the art will appreciate that the teachings herein can be utilized to perform hitless switching between any number of input clock signals. Variations and modifications of the embodiments disclosed herein, may be made based on the description set forth herein, without departing from the scope and spirit of the invention as set forth in the following claims.

What is claimed is:

1. A method comprising:
   providing to a phase-locked loop (PLL) circuit, selected configuration information based, at least in part, on a selected frequency of a reference clock signal and a selected PLL bandwidth;
   generating an output clock signal, by the PLL circuit, based, at least in part, on the reference clock signal and the selected configuration information; and
   storing in a storage circuit, a plurality of sets of configuration information corresponding to a range of frequencies of the reference clock signal and a range of PLL bandwidths, wherein the selected configuration information is accessed from the plurality of sets of configuration information according to the selected frequency and the selected bandwidth;
   wherein generating the output clock signal comprises:
      applying a filtering function to a signal received from a summing node to generate a control signal; and
      generating the output clock signal based, at least in part, on the control signal,
   wherein the configuration information includes at least one parameter for adjusting locations of a zero and higher order poles of the filtering function.

2. The method, as recited in claim 1, wherein generating the output clock signal comprises:
   providing, to a summing node, a phase-difference signal indicative of a phase difference between a first feedback signal and a clock signal that corresponds to the first input clock signal; and
   providing, to the summing node, a feedback current in response to at least the phase-difference signal,
   wherein the configuration information includes at least one parameter for adjusting a number of units of current of the phase difference signal,
   wherein the configuration information includes at least one parameter for adjusting a number of units of the feedback current.

3. The method, as recited in claim 1, wherein the configuration information is received from a serial interface.

4. The method, as recited in claim 1, further comprising:
   selecting the selected frequency of the reference clock signal from a range of reference clock signal frequencies; and selecting the selected PLL bandwidth from a range of PLL bandwidths.

5. The method, as recited in claim 1, wherein the selected frequency of the reference signal and the selected PLL bandwidth are received from a serial interface.

6. The method, as recited in claim 1, wherein the range of reference clock signal frequencies includes frequencies from approximately 2 kHz to 2 MHz.

7. The method, as recited in claim 1, wherein the range of PLL bandwidths includes bandwidths from approximately 60 Hz to 8 kHz.

8. A method comprising:
   providing to a phase-locked loop (PLL) circuit, selected configuration information based, at least in part, on a selected frequency of a reference clock signal and a selected PLL bandwidth;
   generating an output clock signal, by the PLL circuit, based, at least in part, on the reference clock signal and the selected configuration information; and
   storing in a storage circuit, a plurality of sets of configuration information corresponding to a range of frequencies of the reference clock signal and a range of PLL bandwidths, wherein the selected configuration information is accessed from the plurality of sets of configuration information according to the selected frequency and the selected bandwidth;
   switching the reference clock signal between a first input clock signal and a second input clock signal while generating the output clock signal having a substantially fixed phase,
   wherein the configuration information includes at least one parameter for adjusting a programmable phase-difference compensation circuit in accordance with the selected frequency of the reference clock signal and the selected PLL bandwidth.

9. The method, as recited in claim 8, wherein the configuration information includes at least one parameter for adjusting a duty cycle of an output of the programmable phase-difference compensation circuit.

10. The method, as recited in claim 8, wherein the configuration information includes at least one parameter for adjusting a number of active units of charge provided by the programmable phase-difference circuit based, at least in part, on the selected reference clock signal frequency and the selected loop bandwidth.

11. The method, as recited in claim 8, wherein switching comprises:
    detecting a phase difference between a first feedback signal and a clock signal that corresponds to the first input clock signal; and
    compensating the phase difference in response to the first input clock signal being utilized as the reference clock signal, the compensating being based, at least in part, on the phase difference when the second input clock signal was utilized as the reference clock signal prior to the first input clock signal being utilized as the reference clock signal.

12. The method, as recited in claim 11, wherein the compensating has a resolution and a range, the resolution and range being independent from the reference clock signal frequency.

13. The method, as recited in claim 11, wherein the compensating has an accuracy independent from the reference clock signal frequency.

14. An apparatus comprising:
    a programmable phase-locked loop (PLL) configured to generate an output signal based, at least in part, on a reference clock signal, the PLL having a bandwidth selectable from a range of PLL bandwidths and a frequency of the reference clock signal being selectable from a range of reference clock signal frequencies; and
    a first storage circuit configured to provide configuration information to the PLL based, at least in part, on the reference clock signal frequency and the PLL bandwidth,
    wherein the PLL comprises:
       a controllable oscillator circuit; and
       a programmable loop filter circuit responsive to a signal based, at least in part, on a phase-difference signal to generate a control signal for the controllable oscillator circuit,
       wherein the configuration information includes parameters for adjusting locations of a zero and higher order poles of the programmable loop filter circuit.

15. The apparatus, as recited in claim 14, wherein the PLL further comprises:
    a summing node;
    a programmable phase and frequency detector circuit configured to detect a phase difference between a first feedback signal and a clock signal that corresponds to the first input clock signal and configured to provide, to the summing node, a phase-difference signal indicative thereof; and
    a programmable analog-to-digital converter circuit configured to provide, to the summing node, a feedback current in response to at least the phase difference signal,
    wherein the configuration information includes a number of units of current of the phase difference signal and a number of units of the feedback current.

16. The apparatus, as recited in claim 14, further comprising:
    an interface configured to receive the reference clock signal frequency and the PLL bandwidth, the reference clock signal frequency and PLL bandwidth being used to select the configuration information from the first storage circuit.

17. The apparatus, as recited in claim 14, wherein the PLL further comprises a programmable auto-zero loop having a resolution and a range, the resolution and range being independent from the reference clock signal frequency.

18. The apparatus, as recited in claim 17, wherein accuracy of the programmable auto-zero loop is independent from the reference clock signal frequency.

19. The apparatus, as recited in claim 14, wherein the range of reference clock signal frequencies includes frequencies from approximately 2 kHz to approximately 2 MHz.

20. The apparatus, as recited in claim 14, wherein the range of PLL bandwidths includes bandwidths from approximately 60 Hz to approximately 8 kHz.

21. An apparatus comprising:
    a programmable phase-locked loop (PLL) configured to generate an output signal based, at least in part, on a reference clock signal, the PLL having a bandwidth selectable from a range of PLL bandwidths and a frequency of the reference clock signal being selectable from a range of reference clock signal frequencies; and
    a first storage circuit configured to provide configuration information to the PLL based, at least in part, on the reference clock signal frequency and the PLL bandwidth,
    wherein the PLL is configured to switch between a first input clock signal and a second input clock signal as the reference clock signal while generating an output signal having a substantially fixed phase, wherein the PLL comprises:
a programmable phase-difference compensation circuit configured to generate a pulsed phase-difference compensation signal in response to the first input clock signal being utilized as the reference clock signal, the first pulsed phase-difference compensation signal being indicative of the phase difference when the second input clock signal was utilized as the reference clock signal prior to the first input clock signal being utilized as the reference clock signal; and
a programmable phase detector and charge pump circuit configured to detect a phase difference between a first feedback signal and a clock signal that corresponds to the first input clock signal and configured to generate a pulsed phase-difference signal indicative thereof, wherein the configuration information includes parameters for the phase detector and charge pump circuit.

22. The apparatus, as recited in claim 21, wherein the programmable phase-difference compensation circuit comprises a programmable digital-to-analog converter (DAC) configured to generate a pulsed phase-difference compensation signal having a duty cycle, wherein the configuration information includes at least one duty cycle parameter.

23. The apparatus, as recited in claim 22, wherein the programmable DAC comprises a programmable one-shot circuit, the programmable one-shot circuit supplying an output having a duty cycle based, at least in part, on the at least one duty cycle parameter.

24. The apparatus, as recited in claim 21, wherein the programmable phase detector and charge pump circuit comprises a programmable charge pump circuit configured to generate the pulsed phase-difference signal, wherein configuration information includes at least one magnitude parameter of the pulsed phase-difference signal.

25. An apparatus comprising:
programmable phase-locked loop (PLL) means having a selectable frequency of a reference clock signal and a selectable bandwidth, the programmable PLL means generating an output clock signal based, at least in part, on the reference clock signal and selected configuration parameters;
means for storing configuration parameters corresponding to a range of frequencies and a range of bandwidths for the PLL; and
means for selecting among the stored configuration parameters according to a selected frequency and a selected bandwidth;
wherein selected configuration information is provided to the programmable PLL means.

26. The apparatus, as recited in claim 25, wherein the programmable PLL means comprises:
means for filtering a signal to generate a control signal; and
means for generating the output clock signal based, at least in part, on the control signal,
wherein the parameters include filter parameters associated with locations of a zero and higher order poles of the means for filtering.

27. The apparatus, as recited in claim 25, wherein the programmable PLL means comprises:
means for generating a phase-difference signal indicative of a phase difference between a first feedback signal and a clock signal that corresponds to the first input clock signal; and
means for generating a feedback current in response to at least the phase-difference signal,
wherein the parameters include a number of units of the feedback current,
wherein the parameters include a number of units of current of the phase difference signal.

28. The apparatus, as recited in claim 25, wherein the programmable PLL means comprises a means for maintaining a substantially fixed phase of the output clock signal regardless of the reference clock signal switching between a first input clock signal and a second input clock signal.

29. The apparatus, as recited in claim 28, wherein the programmable PLL means further comprises:
means for detecting a phase difference between a first feedback signal and a clock signal that corresponds to the first input clock signal, the means for detecting being programmable based, at least in part, on the reference clock signal frequency and the PLL bandwidth; and
means for compensating the phase difference in response to the first input clock signal being utilized as the reference clock signal, the compensating being based, at least in part, on the phase difference when the second input clock signal was utilized as the reference clock signal prior to the first input clock signal being utilized as the reference clock signal, the means for compensating being programmable based, at least in part, on the reference clock signal frequency and the PLL bandwidth.

30. The apparatus, as recited in claim 29, wherein the means for compensating has a resolution and a range, the resolution and range being independent from the reference clock signal frequency.

31. The apparatus, as recited in claim 29, wherein the means for compensating has an accuracy independent from the reference clock signal frequency.

* * * * *